US011839082B2

United States Patent
Sanuki

(10) Patent No.: US 11,839,082 B2
(45) Date of Patent: Dec. 5, 2023

(54) SEMICONDUCTOR DEVICE AND METHOD OF MANUFACTURING THE SAME

(71) Applicant: Kioxia Corporation, Tokyo (JP)

(72) Inventor: Tomoya Sanuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 206 days.

(21) Appl. No.: 17/396,810

(22) Filed: Aug. 9, 2021

(65) Prior Publication Data

US 2021/0366879 A1    Nov. 25, 2021

Related U.S. Application Data

(62) Division of application No. 16/561,351, filed on Sep. 5, 2019, now Pat. No. 11,127,717.

(30) Foreign Application Priority Data

Mar. 4, 2019    (JP) ................................ 2019-038710

(51) Int. Cl.
   *H10B 43/27*      (2023.01)
   *H01L 23/00*      (2006.01)
   *H01L 25/065*     (2023.01)
   *G11C 5/06*       (2006.01)

(52) U.S. Cl.
   CPC ............. *H10B 43/27* (2023.02); *G11C 5/063* (2013.01); *H01L 24/09* (2013.01); *H01L 25/0657* (2013.01)

(58) Field of Classification Search
None
See application file for complete search history.

(56) References Cited

U.S. PATENT DOCUMENTS

| | | | |
|---|---|---|---|
| 6,078,096 A | 6/2000 | Kimura et al. | |
| 6,208,547 B1 * | 3/2001 | Ooishi | H10B 12/50 257/E27.097 |
| 6,594,818 B2 | 7/2003 | Kim et al. | |
| 8,947,931 B1 | 2/2015 | D'Abreu | |
| 9,558,945 B2 | 1/2017 | Fukuzumi et al. | |

(Continued)

FOREIGN PATENT DOCUMENTS

| | | |
|---|---|---|
| CN | 109314113 A | 2/2019 |
| JP | 11-154738 A | 6/1999 |

(Continued)

*Primary Examiner* — Scott B Geyer
(74) *Attorney, Agent, or Firm* — Oblon, McClelland, Maier & Neustadt, L.L.P.

(57) ABSTRACT

In one embodiment, a semiconductor device includes a first substrate including first and second regions on its surface, a first control circuit on the first substrate in the first region, a first memory cell array above the first control circuit in the first region and connected to the first control circuit, and a first pad above the first memory cell array in the first region and connected to the first control circuit. The device further includes a second control circuit on the first substrate in the second region, a second memory cell array above the second control circuit in the second region and connected to the second control circuit, a second pad above the second memory cell array in the second region and connected to the second control circuit, and a connection line above the first and second memory cell arrays and connecting the first and second pads.

5 Claims, 17 Drawing Sheets

(56) References Cited

U.S. PATENT DOCUMENTS

| | | | |
|---|---|---|---|
| 10,629,616 B1* | 4/2020 | Kai | H10B 43/10 |
| 10,651,187 B2 | 5/2020 | Liu | |
| 10,665,580 B1 | 5/2020 | Hosoda | |
| 10,727,216 B1* | 7/2020 | Kai | H01L 21/6835 |
| 2013/0082404 A1 | 4/2013 | Kajigaya | |
| 2016/0163726 A1 | 6/2016 | Tanzawa | |
| 2018/0047744 A1 | 2/2018 | Utsumi | |
| 2018/0261575 A1 | 9/2018 | Tagami | |
| 2018/0261623 A1* | 9/2018 | Higashi | H10B 43/50 |
| 2018/0277497 A1 | 9/2018 | Matsuo | |
| 2018/0342481 A1 | 11/2018 | Lee | |
| 2018/0358371 A1 | 12/2018 | Hwang | |
| 2019/0043836 A1 | 2/2019 | Fastow | |
| 2019/0088676 A1* | 3/2019 | Tagami | H01L 24/04 |
| 2019/0164991 A1* | 5/2019 | Lim | H01L 23/5226 |
| 2019/0385984 A1 | 12/2019 | Koyanagi | |
| 2020/0006299 A1* | 1/2020 | Liu | H10B 41/50 |
| 2020/0090943 A1 | 3/2020 | Hwang | |
| 2020/0105721 A1 | 4/2020 | Park | |
| 2020/0105735 A1* | 4/2020 | Park | H10B 43/30 |
| 2020/0203328 A1* | 6/2020 | Park | G11C 14/0018 |
| 2020/0203329 A1* | 6/2020 | Kanamori | H10B 43/27 |
| 2020/0279841 A1* | 9/2020 | Sanuki | H01L 25/50 |
| 2020/0328186 A1* | 10/2020 | Liu | G11C 5/025 |
| 2020/0343161 A1* | 10/2020 | Wu | H01L 21/76898 |
| 2020/0343234 A1 | 10/2020 | Klein | |
| 2020/0350322 A1* | 11/2020 | Liu | H01L 21/2007 |
| 2020/0395328 A1* | 12/2020 | Fastow | G11C 16/0483 |
| 2021/0036006 A1* | 2/2021 | Chen | H10B 43/27 |
| 2021/0057427 A1* | 2/2021 | Oh | H10B 41/20 |

FOREIGN PATENT DOCUMENTS

| | | |
|---|---|---|
| JP | 2003-273229 A | 9/2003 |
| JP | 3592885 B2 | 11/2004 |
| JP | 2010-129686 A | 6/2010 |
| JP | 4740498 B2 | 8/2011 |
| JP | 6203152 B2 | 9/2017 |
| TW | 201836125 A | 10/2018 |

* cited by examiner

SEMICONDUCTOR DEVICE AND METHOD OF MANUFACTURING THE SAME

CROSS REFERENCE TO RELATED APPLICATION

This application is a division of and claims the benefit of priority under 35 U.S.C. § 120 from U.S. application Ser. No. 16/561,351 filed Sep. 5, 2019, and claims the benefit of priority under 35 U.S.C. § 119 from Japanese Patent Application No. 2019-038710 filed Mar. 4, 2019, the entire contents of each of which are incorporated herein by reference.

FIELD

Embodiments described herein relate to a semiconductor device and a method of manufacturing the same.

BACKGROUND

It is desired to manufacture semiconductor chips efficiently. For example, if different memory chips can be processed with the same mask set in a preceding process and then processed to have different capacities in a succeeding process, there is no need to prepare different mask sets, which can improve efficiency of the manufacture.

DETAILED DESCRIPTION

In one embodiment, a semiconductor device includes a first substrate including a first region and a second region on a surface of the first substrate. The device further includes a first control circuit provided on the first substrate in the first region, a first memory cell array provided above the first control circuit in the first region and electrically connected to the first control circuit, and a first pad provided above the first memory cell array in the first region and electrically connected to the first control circuit. The device further includes a second control circuit provided on the first substrate in the second region, a second memory cell array provided above the second control circuit in the second region and electrically connected to the second control circuit, and a second pad provided above the second memory cell array in the second region and electrically connected to the second control circuit. The device further includes a connection line provided above the first memory cell array and the second memory cell array and electrically connecting the first pad to the second pad.

Embodiments will now be explained with reference to the accompanying drawings. In FIGS. 1 to 21, same or similar components are denoted by the same reference symbols, and redundant description thereof will be omitted.

First Embodiment

Figure 1:
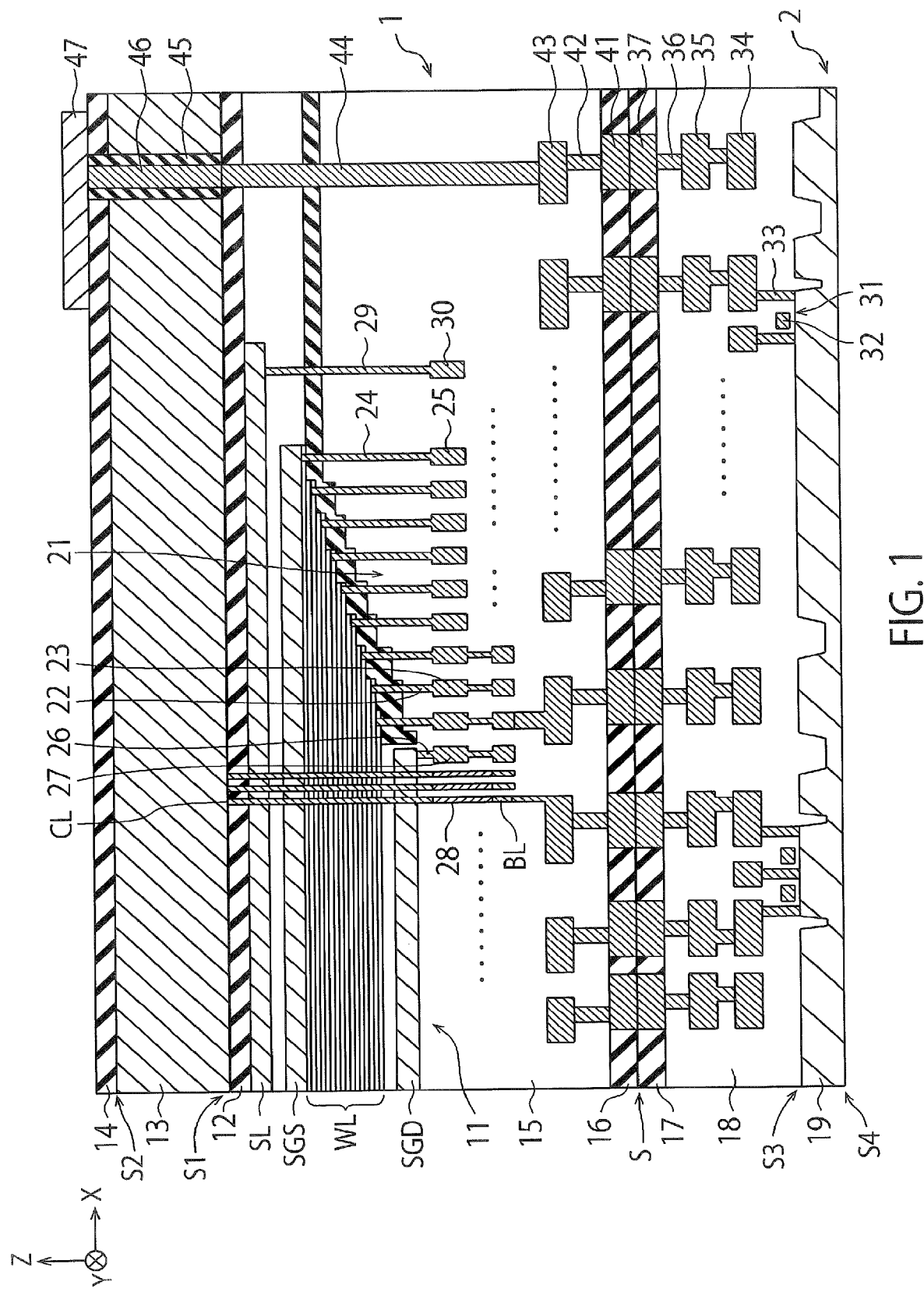
FIG. 1 is a sectional view showing a structure of a semiconductor device of a first embodiment.

FIG. 1 is a sectional view showing a structure of a semiconductor device of a first embodiment. The semiconductor device of FIG. 1 is a three-dimensional memory in which an array chip 1 is bonded to a circuit chip 2.

The array chip 1 includes a memory cell array 11 including plural memory cells, an insulating layer 12 on the memory cell array 11, a substrate 13 on the insulating layer 12, an insulating layer 14 on the substrate 13, an inter layer dielectric 15 under the memory cell array 11, and a first insulating layer 16 under the inter layer dielectric 15. The insulating layers 12 and 14 are, for example, silicon oxide films or silicon nitride films. The substrate 13 is, for example, a semiconductor substrate such as a silicon substrate.

The circuit chip 2 is provided under the array chip 1. Reference symbol S denotes a bonding surface between the array chip 1 and circuit chip 2. The circuit chip 2 includes a second insulating layer 17, an inter layer dielectric 18 under the second insulating layer 17, and a substrate 19 under the inter layer dielectric 18. The substrate 19 is, for example, a semiconductor substrate such as a silicon substrate.

FIG. 1 shows an X direction and Y direction perpendicular to each other and parallel to surfaces S1 and S2 of the substrate 13 and surfaces S3 and S4 of the substrate 19 as well as a Z direction perpendicular to surfaces S1 and S2 of the substrate 13 and surfaces S3 and S4 of the substrate 19. In the present specification, a +Z direction is treated as an upward direction and −Z direction is treated as a downward direction. For example, the memory cell array 11 is located above the substrate 19 and below the substrate 13. The −Z direction may or may not coincide with the gravity direction.

As an electrode layer in the memory cell array 11, the array chip 1 includes plural word lines WL, a source-side selection gate SGS, a drain-side selection gate SGD, and a source line SL. FIG. 1 shows a staircase structure 21 of the memory cell array 11. As shown in FIG. 1, each of the word lines WL is electrically connected with a word interconnection layer 23 via a contact plug 22 and the source-side selection gate SGS is electrically connected with source-side selection gate interconnection layers 25 via contact plugs 24.

Furthermore, the drain-side selection gate SGD is electrically connected with a drain-side selection gate interconnection layer 27 via a contact plug 26 and the source line SL is electrically connected with a source interconnection layer 30 via a contact plug 29. Each columnar portion CL penetrating the word lines WL, source-side selection gate SGS, drain-side selection gate SGD, and source line SL is electrically connected with a bit line BL via a plug 28 and electrically connected with the substrate 13.

The circuit chip 2 includes plural transistors 31. The transistors 31 include respective gate electrodes 32 provided on the substrate 19 via gate insulators as well as non-illustrated source diffusion layers and drain diffusion layers provided in the substrate 19. The circuit chip 2 further includes plural plugs 33 provided on the source diffusion layers or drain diffusion layers of the transistors 31, an interconnection layer 34 provided on the plugs 33 and including plural interconnections, and an interconnection layer 35 provided on the interconnection layer 34 and including plural interconnections. The circuit chip 2 further includes plural via plugs 36 provided on the interconnection layer 35 and plural second metal pads 37 provided on the via plugs 36 in the second insulating layer 17. The circuit chip 2 functions as a control circuit (logic circuit) adapted to control the array chip 1.

The array chip 1 includes plural first metal pads 41 provided on the second metal pads 37 in the first insulating layer 16, plural via plugs 42 provided on the first metal pads 41, and an interconnection layer 43 provided on the via plugs 42 and including plural interconnections. The word lines WL and bit lines BL of the present embodiment are electrically connected with corresponding interconnections in the interconnection layer 43. The array chip 1 further includes a first plug 44 provided on the interconnection layer 43 as well as being provided in the inter layer dielectric 15 and insulating layer 12, a second plug 46 provided on the first plug 44 as well as being provided in the substrate 13 and insulating layer 14 via an insulating layer 45, and a pad 47 provided on the insulating layer 14 and second plug 46. The pad 47 is an external connecting pad (bonding pad) of the semiconductor device of the present embodiment and is connectable to a mounting substrate or another device via a soldering ball, metal bump, bonding wire, or the like.

Although in the present embodiment, the first insulating layer 16 is formed on a lower surface of the inter layer dielectric 15, the first insulating layer 16 may be included in and integrated with the inter layer dielectric 15. Similarly, although the second insulating layer 17 is formed on an upper surface of the inter layer dielectric 18 the second insulating layer 17 may be included in and integrated with the inter layer dielectric 18.

Figure 2:
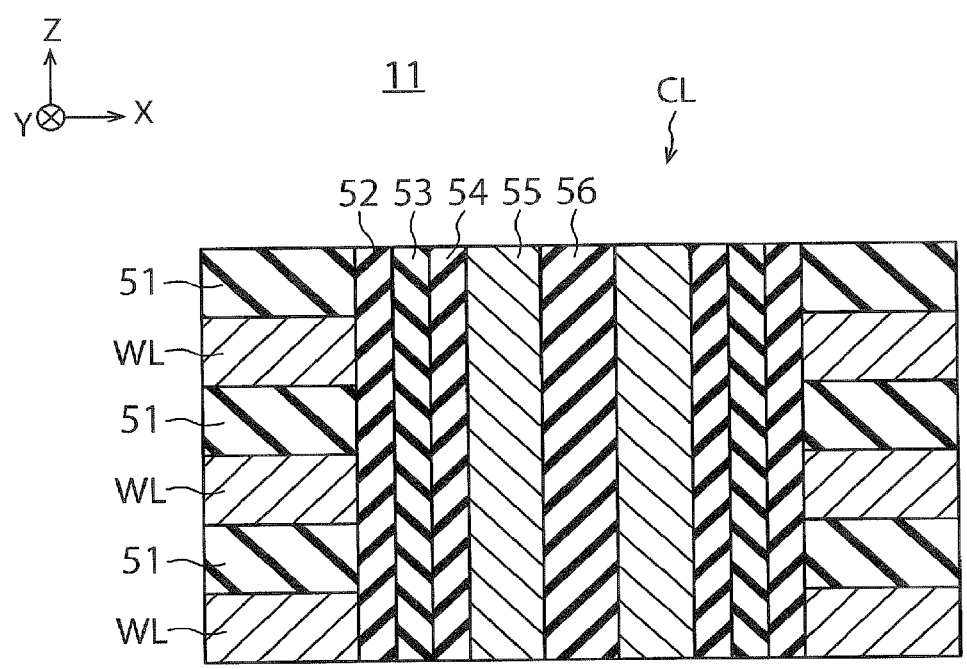
FIG. 2 is a sectional view showing a structure of a columnar portion included in the semiconductor device of the first embodiment.

FIG. 2 is a sectional view showing a structure of the columnar portion CL included in the semiconductor device of the first embodiment.

As shown in FIG. 2, the memory cell array 11 includes plural word lines WL and plural insulating layers 51 stacked alternately on the inter layer dielectric 15. Each of the word lines WL is, for example, a W (tungsten) layer. Each of the insulating layers 51 is, for example, a silicon oxide film.

The columnar portion CL includes in order of a block insulator 52, a charge storage layer 53, a tunnel insulator 54, a channel semiconductor layer 55, and a core insulator 56. The charge storage layer 53 is, for example, a silicon nitride film, and is formed on side faces of the word lines WL and insulating layers 51 via a block insulator 52. The channel semiconductor layer 55 is, for example, a silicon layer and is formed on a side face of the charge storage layer 53 via the tunnel insulator 54. Examples of the block insulator 52, tunnel insulator 54, and core insulator 56 include silicon oxide films and metal insulators.

Figure 3:
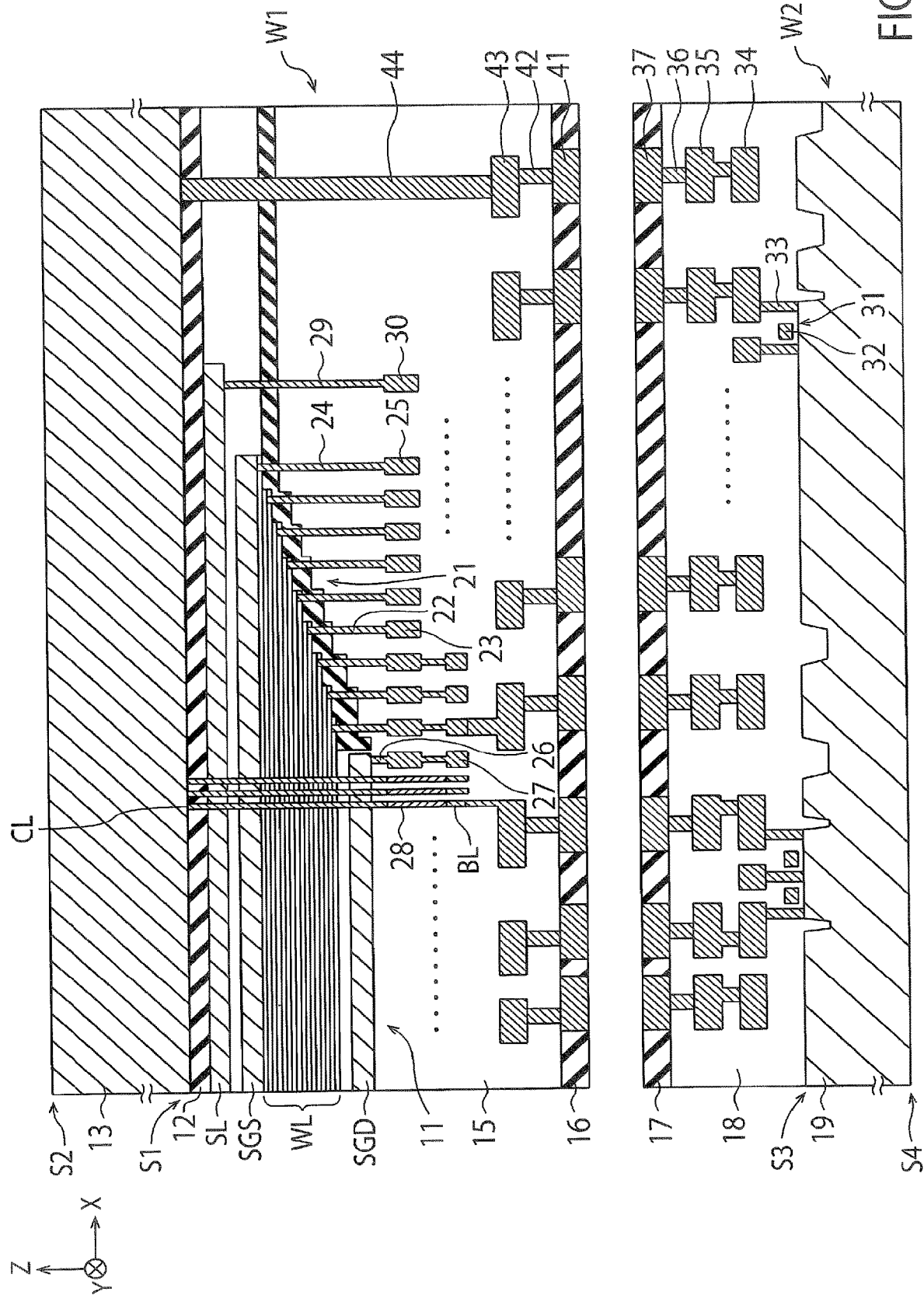
FIG. 3 is a sectional view showing a method of manufacturing the semiconductor device of the first embodiment.

FIG. 3 is a sectional view showing a method of manufacturing the semiconductor device of the first embodiment. FIG. 3 shows an array wafer W1 including plural array chips 1 and a circuit wafer W2 including plural circuit chips 2. The array wafer W1 is also called a memory wafer and the circuit wafer W2 is also called a CMOS wafer.

First, the array wafer W1 is bonded to the circuit wafer W2 by mechanical pressure. Consequently, the first insulating layer 16 is adhered to the second insulating layer 17. Next, the array wafer W1 and the circuit wafer W2 are annealed at 400 degrees C. Consequently, the first metal pads 41 are joined to the second metal pads 37.

Subsequently, the substrates 13 and 19 are thinned by CMP (Chemical Mechanical Polishing), and then the array wafer W1 and the circuit wafer W2 are diced into plural chips. In this way, the semiconductor device of FIG. 1 is manufactured. The insulating layer 14, insulator 45, second plug 46, and the pad 47 are formed on or in the substrate 13, for example, after the thinning of the substrate 13.

Although the array wafer W1 is bonded to the circuit wafer W2 in the present embodiment, the array wafer W1 may be bonded to another array wafer W1 instead. The description given above with reference to FIGS. 1 to 3 and description to be given later with reference to FIGS. 4 to 18 are also applicable to bonding between array wafers W1.

Also, while FIG. 1 shows a boundary surface between the first insulating layer 16 and second insulating layer 17 as well as a boundary surface between the first metal pads 41 and second metal pads 37, generally these boundary surfaces become unobservable after the annealing. However, locations where the boundary surfaces existed can be estimated by detecting, for example, inclinations of side faces of the first metal pads 41 and side faces of the second metal pads 37 or displacement between the side faces of the first metal pads 41 and the second metal pads 37.

Figure 4:
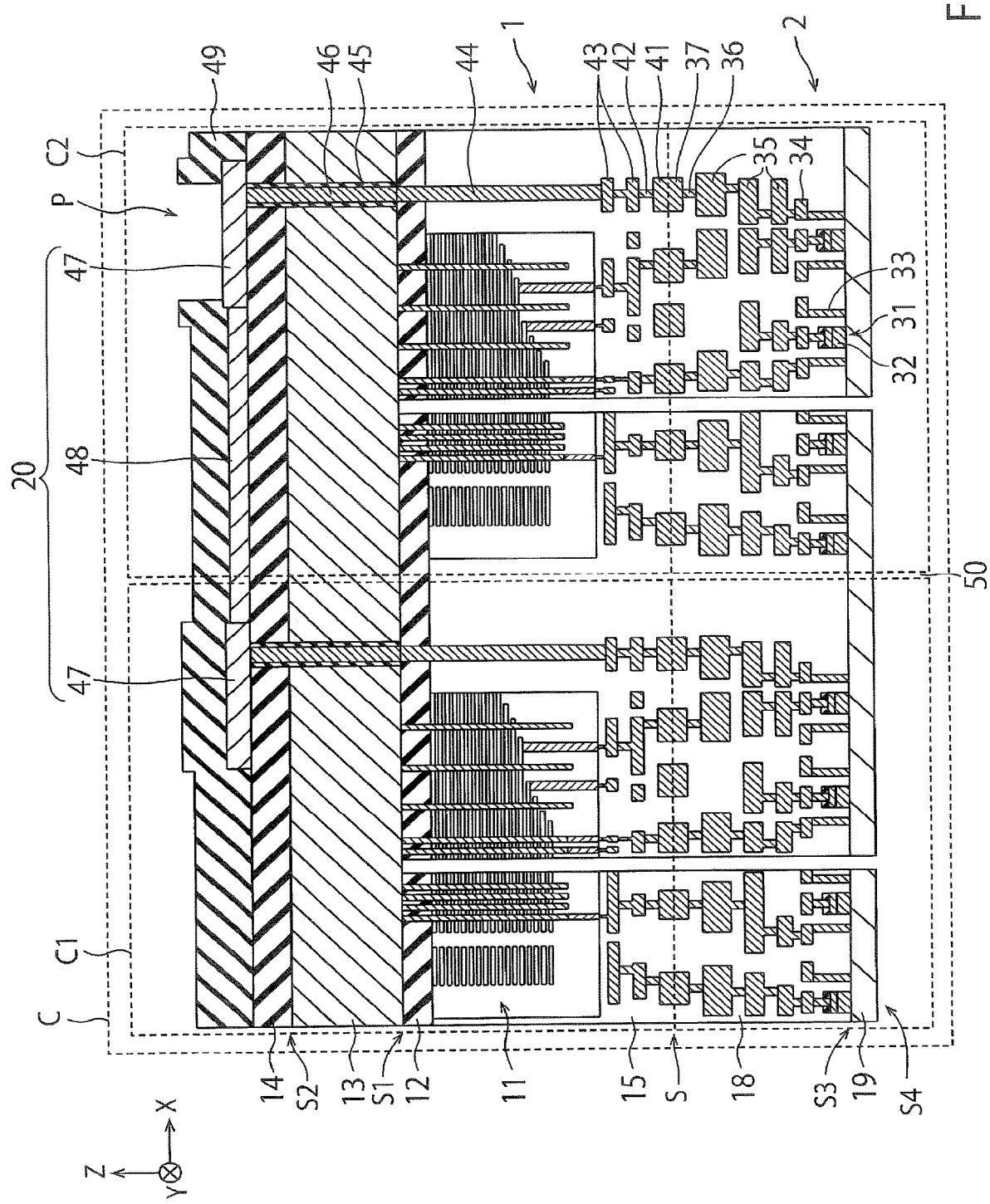
FIG. 4 is another sectional view showing the structure of the semiconductor device of the first embodiment.
Figure 5:
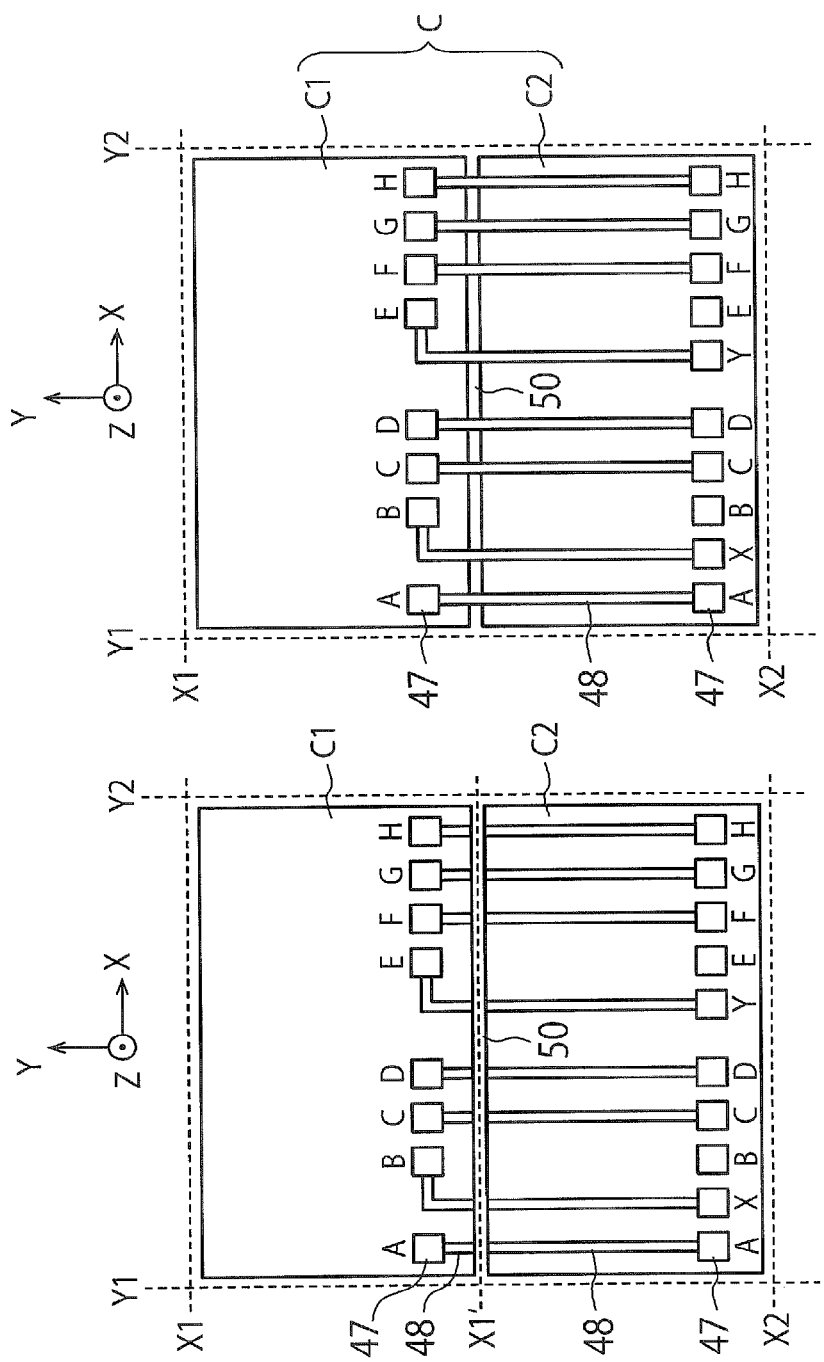
FIGS. 5A and 5B are plan views showing first and second examples of the semiconductor device of the first embodiment.
Figure 6:
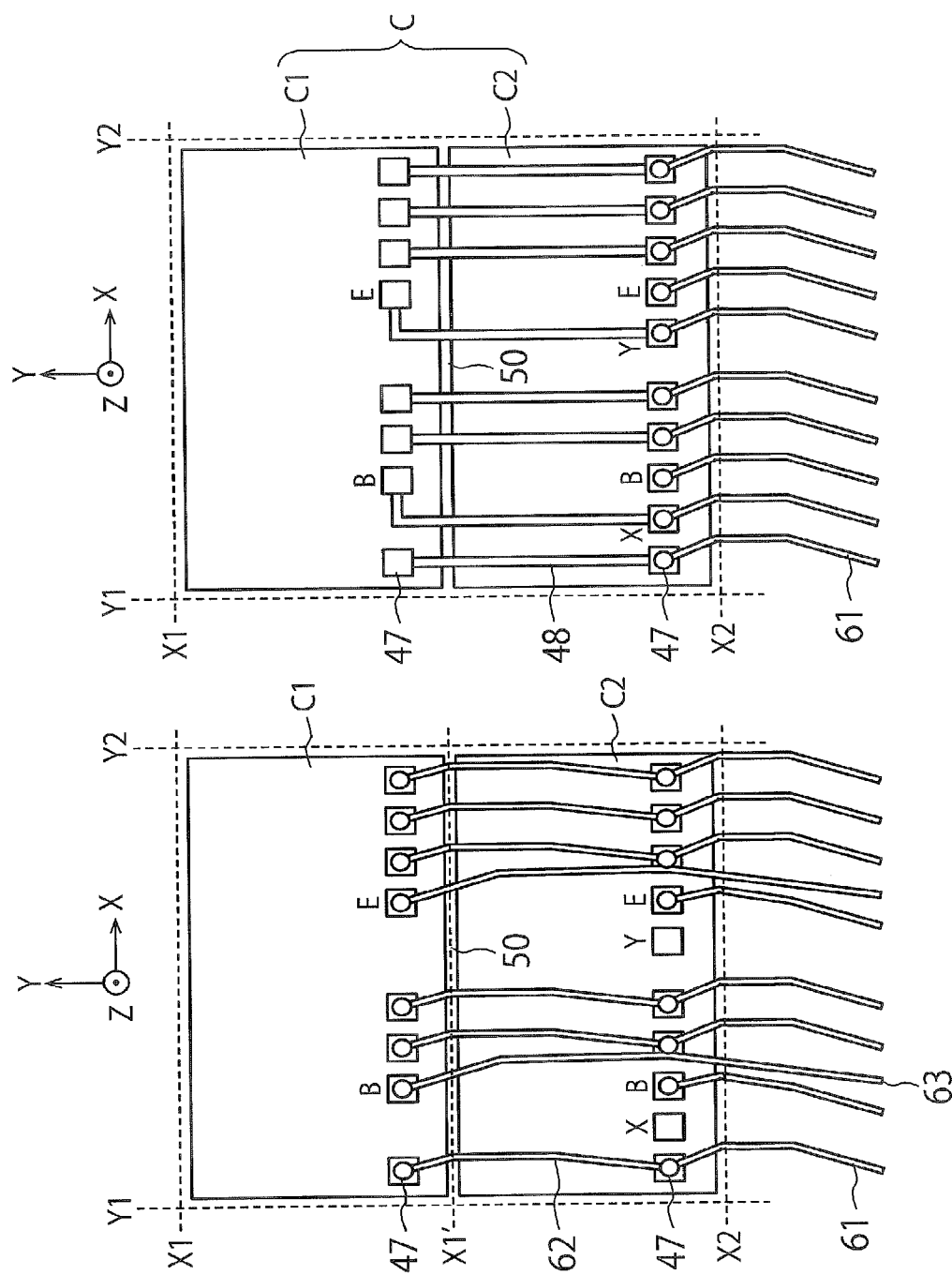
FIGS. 6A and 6B are other plan views showing the first and second examples of the semiconductor device of the first embodiment.
Figure 7:
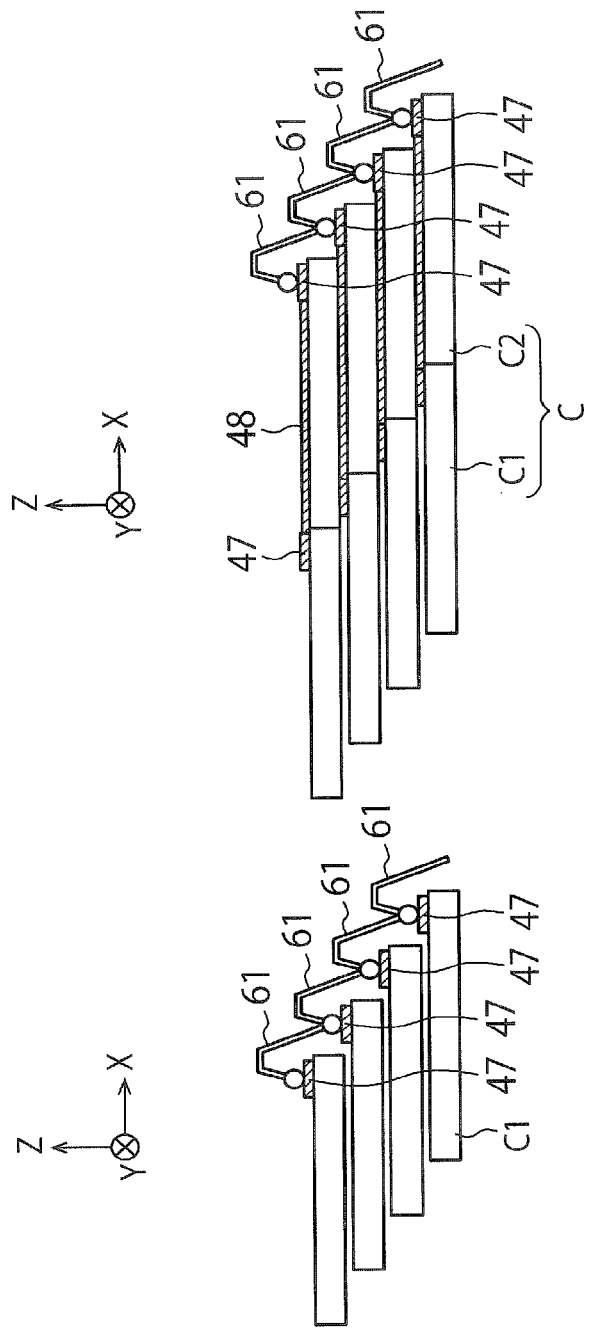
FIGS. 7A and 7B are sectional views showing the first and second examples of the semiconductor device of the first embodiment.

FIG. 4 is another sectional view showing the structure of the semiconductor device of the first embodiment. FIG. 4 shows a section of the semiconductor device as with FIG. 1, but the structure of the semiconductor device is shown from a different perspective from FIG. 1.

According to the present embodiment, the array wafer W1 and the circuit wafer W2 after the bonding but before dicing include plural dual chips C, each of which includes a first single chip C1 and second single chip C2 (FIG. 4). Each of the first single chip C1 and second single chip C2 corresponds to one semiconductor device shown in FIG. 1.

The array wafer W1 and the circuit wafer W2 after the bonding may be diced into individual single chips C1 and C2 or into individual dual chips C. FIG. 4 shows a semiconductor device manufactured by dicing an array wafer into individual dual chips C. Consequently, the semiconductor device of FIG. 4 is made up of one dual chip C including a first single chip C1 and second single chip C2.

The semiconductor device of FIG. 4 includes the array chip 1 and circuit chip 2 in the first single chip C1 as well as the array chip 1 and circuit chip 2 in the second single chip C2. The memory cell array 11 and circuits such as a logic circuit in the first single chip C1 are provided on the side of the surface S1 of the substrate 13, between the surface S1 of the substrate 13 and surface S3 of the substrate 19. Similarly, the memory cell array 11 and circuits such as a logic circuit in the second single chip C2 are provided on the side of the surface S1 of the substrate 13, between the surface S1 of the substrate 13 and surface S3 of the substrate 19. The memory cell array 11 and logic circuit in the first single chip C1 are examples of a first memory array and first control circuit, respectively. The memory cell array 11 and logic circuit in the second single chip C2 are examples of a second memory array and second control circuit, respectively. The substrate 19 is an example of a first substrate and the substrate 13 is an example of a second substrate. Also, a region of the first single chip C1 on the substrate 19 is an example of a first region and a region of the second single chip C2 on the substrate 19 is an example of a second region.

The first single chip C1 includes a first plug 44 electrically connected with the memory cell array 11 and logic circuit in the first single chip C1, a second plug 46 provided on the first plug 44, and the pad 47 provided on the second plug 46. In the first single chip C1, the second plug 46 penetrates the substrate 13 and the pad 47 is provided on the side of a surface S2 of the substrate 13. The pad 47 is an example of a first pad.

Also, the second single chip C2 includes a first plug 44 electrically connected with the memory cell array 11 and logic circuit in the second single chip C2, a second plug 46 provided on the first plug 44, and the pad 47 provided on the second plug 46. In the second single chip C2, the second plug 46 penetrates the substrate 13 and the pad 47 is provided on the side of a surface S2 of the substrate 13. The pad 47 is an example of a second pad.

FIG. 4 further shows an interconnection layer 20 formed on the insulating layer 14 on the side of a surface S2 of the substrate 13. The interconnection layer 20 is a metal conductive layer such as an Al (aluminum) layer. The interconnection layer 20 includes an interconnection (routing interconnection) 48 configured to electrically connect the pad 47 in the first single chip C1 with the pad 47 in the second single chip C2. The interconnection 48 is an example of a connection line and the interconnection layer 20 is an example of a metal layer.

The interconnection layer 20 of the present embodiment includes not only the interconnection 48, but also the pad 47 in the first single chip C1 and the pad 47 in the second single chip C2. That is, the pads 47 and interconnection 48 of the present embodiment are formed of the same interconnection layer 20. This makes it possible to form the pads 47 and interconnection 48 in a simple manner. Although FIG. 4 shows a step between upper surfaces of the pads 47 and interconnection 48 for ease of understanding, such a step does not need to be provided. The pad 47 in the first single chip C1, the pad 47 in the second single chip C2, and the interconnection 48 make up the interconnection layer 20 by being continuous with one another.

The pad 47 in the first single chip C1 is used as an external connecting pad of the first single chip C1 when the array wafer W1 and the circuit wafer W2 are diced into individual single chips. Also, the pad 47 in the second single chip C2 is used as an external connection pad of the second single chip C2 when the array wafer W1 and the circuit wafer W2 are diced into individual single chips.

On the other hand, in dicing the array wafer W1 and the circuit wafer W2 into individual dual chips, only either of the pad 47 in the first single chip C1 and the pad 47 in the second single chip C2 is used as an external connecting pad common to the first and second single chips C1 and C2. According to the present embodiment, only the pad 47 in the second single chip C2 is used as an external connecting pad.

The interconnection 48 of the present embodiment is provided for use in dicing the array wafer W1 and the circuit wafer W2 into individual dual chips. Specifically, input current and input voltage to the pad 47 in the second single chip C2 are supplied not only to circuits in the second single chip C2, but also to circuits in the first single chip C1 via the interconnection 48. On the other hand, output current and output voltage to the pad 47 in the second single chip C2, are supplied not only from the circuits in the second single chip C2, but also from the circuits in the first single chip C1 via the interconnection 48.

FIG. 4 further shows a passivation film 49 formed on the interconnection layer 20 on the side of the surface S2 of the substrate 13. The passivation film 49 is, for example, an insulator such as a silicon oxide film. The passivation film 49 may have openings P on the pads 47 in both the first and second single chips C1 and C2 or may have an opening P on the pad 47 in one of the first and second single chips C1 and C2. According to the present embodiment, since only the pad 47 in the second single chip C2 is used as an external connecting pad, an opening P is provided only on the pad 47 in the second single chip C2.

The semiconductor device of FIG. 4 further includes a dicing line 50 for use in dicing the first single chip C1 and second single chip C2. The first single chip C1 and second single chip C2 of FIG. 4 are adjacent to each other in the X direction, and consequently the dicing line 50 extends in the Y direction. Because the semiconductor device of FIG. 4 is manufactured by dicing the array wafer W1 and the circuit wafer W2 into individual dual chips, the dicing line 50 eventually remains unused for dicing.

The interconnection 48 of the present embodiment is formed to cross the dicing line 50, i.e., formed at a position where the interconnection 48 overlaps with the dicing line 50 in the Z direction. Therefore, when the array wafer W1 and the circuit wafer W2 are diced into individual single chips, the dicing line 50 is cut, thereby cutting the interconnection 48. According to the present embodiment, when the array wafer W1 and the circuit wafer W2 are diced into individual single chips, because there is no need to use the interconnection 48, there is no problem even if the interconnection 48 is cut as described above.

When the dicing line 50 of FIG. 4 is cut, an end face of the substrate 13 in the first single chip C1 is formed on the dicing line 50. The interconnection 48 in the first single chip C1 extends from the pad 47 in the first single chip C1 to right above the end face. Therefore, when the array wafer W1 and the circuit wafer W2 are diced into individual single chips, the interconnection 48 in the first single chip C1 has a shape such that the interconnection 48 extends to a position where the interconnection 48 overlaps with the end face of the substrate 13 in the Z direction to be electrically open. Similarly, the interconnection 48 in the second single chip C2 also has a shape such that the interconnection 48 extends to a position where the interconnection 48 overlaps with the end face of the substrate 13 in the Z direction to be electrically open. The Z direction is an example of a first direction.

Other than the interconnection 48, the dual chip C of the present embodiment does not include an interconnection electrically connecting the first single chip C1 and second single chip C2 to cross the dicing line 50 of FIG. 4. Consequently, even if the dicing line 50 is cut, no interconnection is cut except the interconnection 48. Therefore, the first single chip C1 and second single chip C2 of the present embodiment function as semiconductor chips even if cut off from each other. To put it another way, according to the present embodiment, no interconnection other than the interconnection 48 is provided on the dicing line 50 such that the first single chip C1 and second single chip C2 can function as semiconductor chips even if cut off from each other.

FIGS. 5A and 5B are plan views showing first and second examples of the semiconductor device of the first embodiment.

As a first example, FIG. 5A shows a semiconductor device equipped with the first and second single chips C1 and C2 cut off from each other. Straight lines X1, X1', X2, Y1, and Y2 indicate the dicing lines 50 to be cut. It should be noted that the dicing line 50 between the first single chip C1 and second single chip C2 is cut as indicated by the straight line X1'.

As a second example, FIG. 5B shows a semiconductor device equipped with the dual chip C, i.e., the first and second single chips C1 and C2 not cut off from each other. Straight lines X1, X2, Y1, and Y2 indicate the dicing lines 50 to be cut. It should be noted that the dicing line 50 between the first single chip C1 and second single chip C2 is not cut as seen from the fact that the straight line X1' is not shown.

As shown in each of FIGS. 5A and 5B, the first single chip C1 includes eight pads 47 denoted by reference symbols A to H and the second single chip C2 includes ten pads 47 denoted by reference symbols A to H, X, and Y. Hereinafter these pads 47 will be referred to as "pad A," "pad B," "pad C," and the like as appropriate.

The pads 47 in the first single chip C1 correspond to the pads 47 denoted by the same reference symbols in the second single chip C2. That is, the pads A to H in the first single chip C1 correspond to the pads A to H in the second single chip C2. Therefore, as shown in FIG. 5B, the pads A, C, D, F, G, and H in the first single chip C1 are electrically connected to the pads A, C, D, F, G, and H in the second single chip C2, respectively, by the interconnections 48. On the other hand, by way of exception, the pads B and E in the first single chip C1 are electrically connected to the pads X and Y in the second single chip C2, respectively, by the interconnections 48. In FIG. 5A, all of these interconnections 48 are cut.

FIGS. 6A and 6B are other plan views showing the first and second examples of the semiconductor device of the first embodiment.

FIG. 6A corresponds to the first example in FIG. 5A. In FIG. 6A, the pads A to H in the second single chip C2 are connected to non-illustrated terminals inside or outside the semiconductor device by bonding wires 61. For reference symbols of the pads 47, refer to FIG. 5A.

Also, the pads A, C, D, F, G, and H in the first single chip C1 are connected to the pads A, C, D, F, G, and H in the second single chip C2, respectively, by bonding wires 62. This allows the pads A, C, D, F, G, and H in the first single chip C1 to have the same functions as the pads A, C, D, F, G, and H in the second single chip C2, respectively.

Furthermore, the pads B and E in the first single chip C1 are connected to non-illustrated terminals inside or outside the semiconductor device by bonding wires 63 as with the pads B and E in the second single chip C2. This allows the pads B and E in the first single chip C1 to have the same functions as the pads B and E in the second single chip C2, respectively. In FIG. 6A, the pads X and Y in the second single chip C2 are not used.

FIG. 6B corresponds to the second example in FIG. 5B. In FIG. 6B, the pads A to H, X, and Y in the second single chip C2 are connected to non-illustrated terminals inside or outside the semiconductor device by the bonding wires 61. For reference symbols of the pads 47, refer to FIG. 5B.

Here, in FIG. 6B, the pads A, C, D, F, G, and H in the first single chip C1 are connected to the pads A, C, D, F, G, and H in the second single chip C2, respectively, by the interconnections 48. This allows the pads A, C, D, F, G, and H in the first single chip C1 to have the same functions as the pads A, C, D, F, G, and H in the second single chip C2, respectively.

Furthermore, in FIG. 6B, the pads B and E in the first single chip C1 are connected to the pads X and Y in the second single chip C2, respectively, by the interconnections 48. Therefore, just as the pad B in the second single chip C2 is connected to a non-illustrated terminal inside or outside the semiconductor device by the bonding wire 61, the pad B in the first single chip C1 is also connected to non-illustrated terminals inside or outside the semiconductor device by the interconnections 48, the pad X in the second single chip C2, and the bonding wire 61 of the pad X. Also, just as the pad E in the second single chip C2 is connected to a non-illustrated terminal inside or outside the semiconductor device by the bonding wire 61, the pad E in the first single chip C1 is also connected to non-illustrated terminals inside or outside the semiconductor device by the interconnection 48, the pad Y in the second single chip C2, and the bonding wire 61 of the pad Y. This allows the pads B and E in the first single chip C1 to have the same functions as the pads B and E in the second single chip C2, respectively.

Examples of the pads B and E include a pad 47 for a chip enable signal. Generally, the chip enable signals have to be supplied separately to the first single chip C1 and second single chip C2. Therefore, the pads B and E of the present embodiment are implemented in a form different from the pad A, C, D, F, G, and H.

In this way, the semiconductor device of the present embodiment may be configured as with the first example or configured as with the second example. In the first example, the bonding wires 61, 62, and 63 are bonded to both the pads 47 in the first single chip C1 and the pads 47 in the second single chip C2. On the other hand, in the second example, the bonding wire 61 is bonded only to the pads 47 in the second single chip C2 out of the pads 47 in the first single chip C1 and the pads 47 in the second single chip C2. However, in the second example, since the pads 47 in the first single chip C1 and the pads 47 in the second single chip C2 are electrically connected by the interconnections 48, the semiconductor device of the second example can function in a manner similar to the first example.

In the first and second examples, a semiconductor device having a storage capacity twice as large as one single chip can be manufactured in a simple manner.

FIGS. 7A and 7B are sectional views showing the first and second examples of the semiconductor device of the first embodiment.

FIG. 7A shows a variation of the first example shown in FIGS. 5A and 6B. The semiconductor device of FIG. 7A includes four first single chips C1 stacked one on top of another. The pads 47 in the first single chips C1 are interconnected by the bonding wires 61. Consequently, a semiconductor device having a storage capacity four times as large as one single chip can be manufactured in a simple manner.

FIG. 7B shows a variation of the second example shown in FIGS. 5A and 6B. The semiconductor device of FIG. 7B includes four first dual chips C stacked one on top of another. In each of the dual chips C, the pads 47 in the first single chip C1 and the pads 47 in the second single chip C2 are interconnected by the interconnections 48. Furthermore, the pads 47 in the first single chips C1 of different dual chips C are interconnected by the bonding wires 61. Consequently, a semiconductor device having a storage capacity eight times as large as one single chip can be manufactured in a simple manner.

Figure 8:
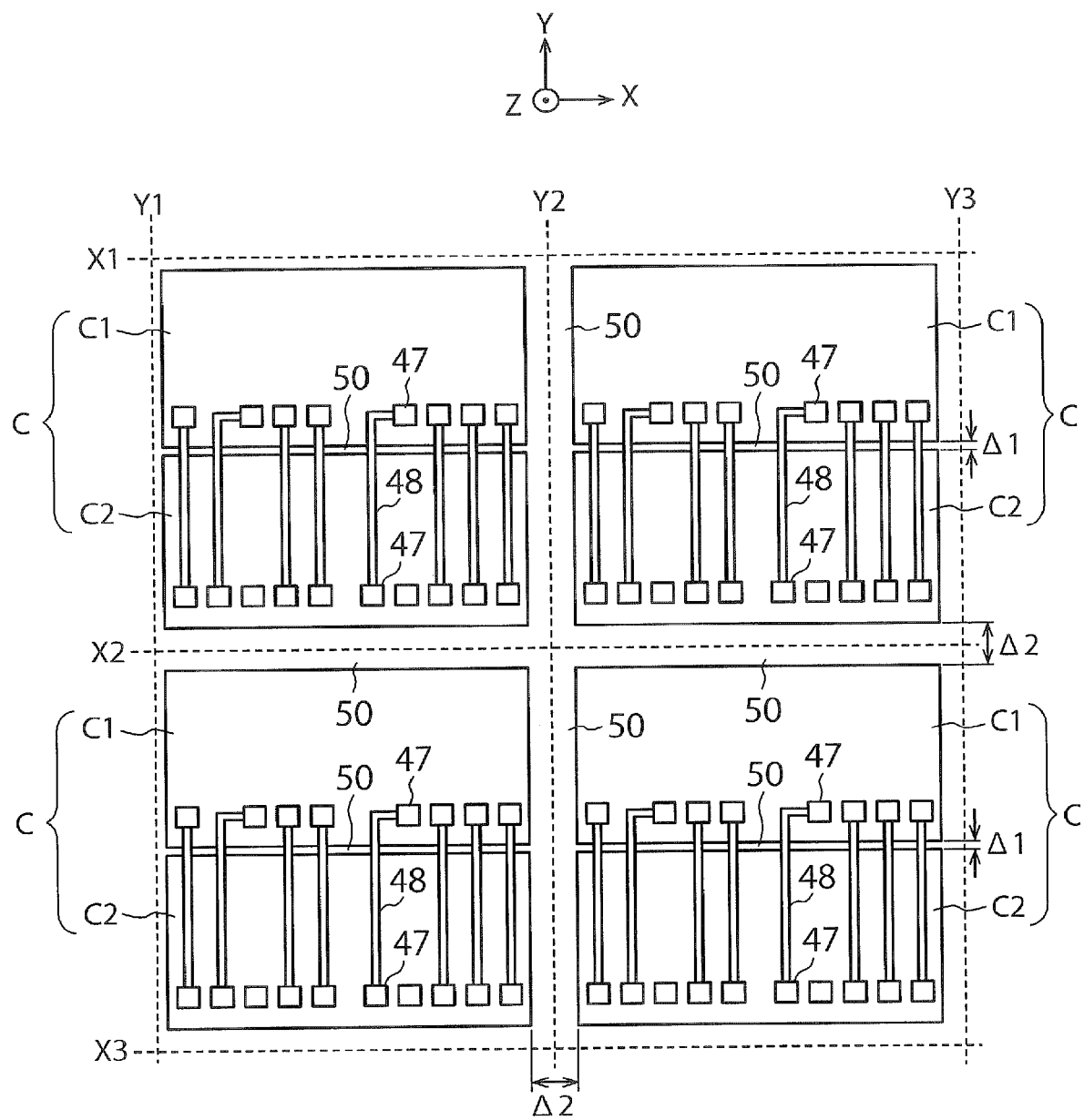
FIG. 8 is another plan view showing the second example of the semiconductor device of the first embodiment.

FIG. 8 is another plan view showing the second example of the semiconductor device of the first embodiment.

FIG. 8 shows the second example of FIG. 5B and the like in more detail, and more specifically, shows four dual chips C. According to the present embodiment, the dicing line 50 between the first single chip C1 and second single chip C2 of the same dual chip C has a small width Δ1 and the dicing line 50 between the dual chips C has a large width Δ2. The width Δ1 is an example of a first width and the width Δ2 is an example of a second width.

Straight lines X1, X2, X3, Y1, Y2, and Y3 of FIG. 8 indicate dicing lines 50 to be cut in the second example. In the second example, the dicing lines 50 with the width Δ1 are not cut and only the dicing lines 50 with the width Δ2 are cut. The interconnections 48 are configured to cross the dicing lines 50 with the width Δ1, but not to cross the dicing lines 50 with the width Δ2. Consequently, in the second example, the interconnections 48 are not cut by dicing.

Figure 9:
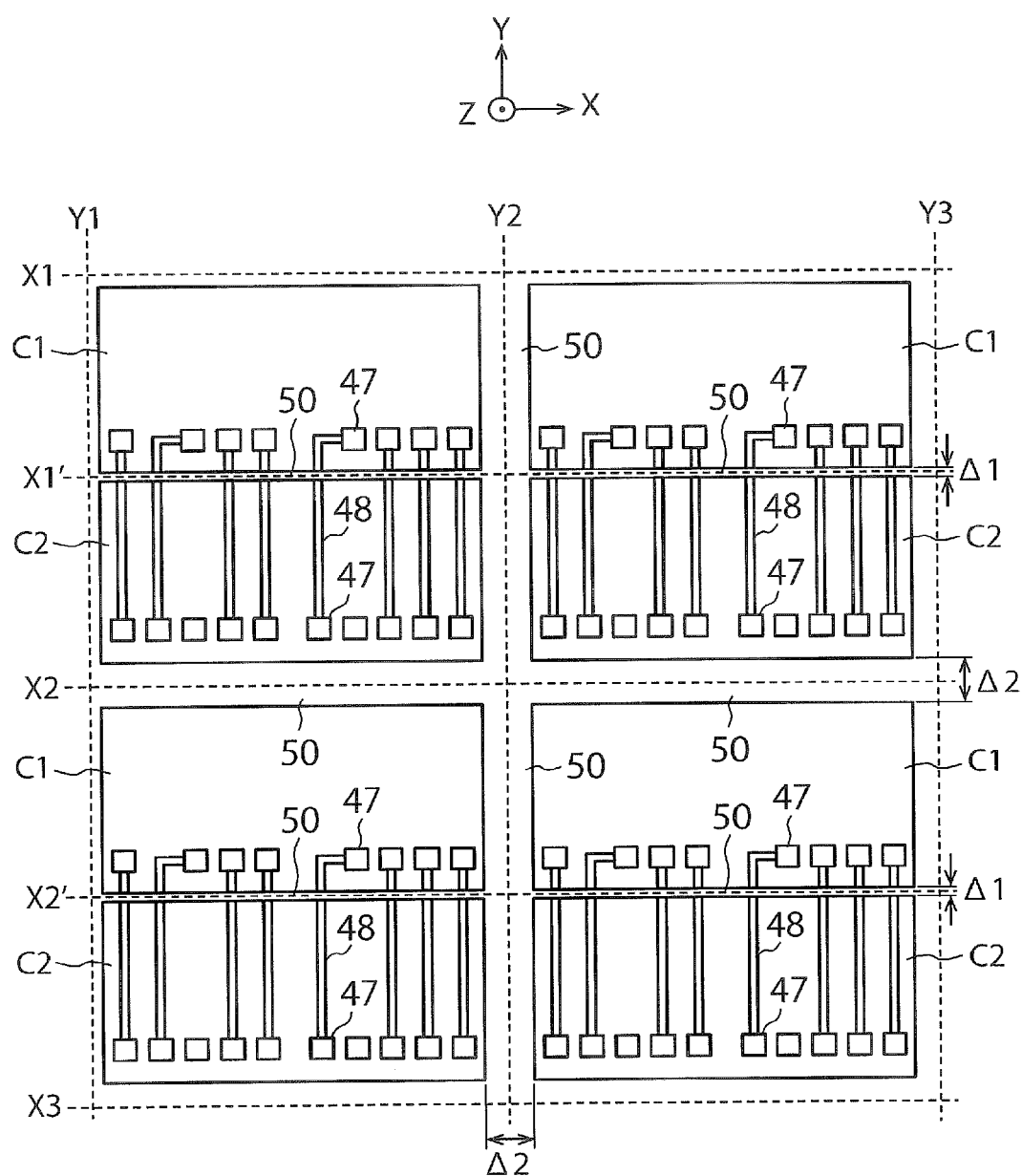
FIG. 9 is another plan view showing the first example of the semiconductor device of the first embodiment.
Figure 10:
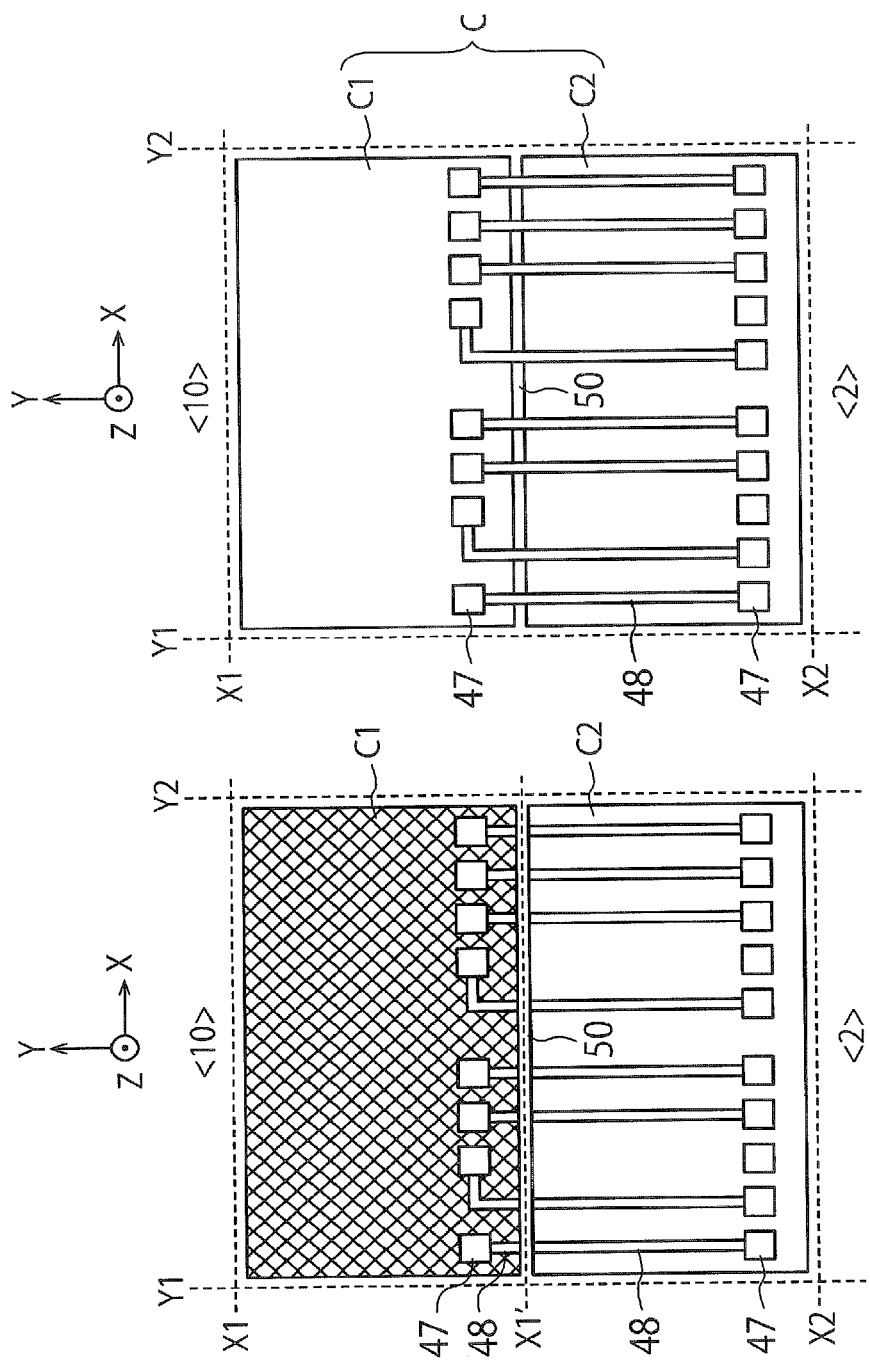
FIGS. 10A and 10B are plan views for explaining a yield of the semiconductor device of the first embodiment.

FIG. 9 is another plan view showing the first example of the semiconductor device of the first embodiment.

FIG. 9 shows the first example of FIG. 5A and the like in more detail, and more specifically, shows four sets of the first and second single chips C1 and C2. The widths Δ1 and Δ2 of the dicing lines 50 are set as in the case of the second example.

Straight lines X1, X1', X2, X2', X3, Y1, Y2, and Y3 of FIG. 9 indicate dicing lines 50 to be cut in the first example. In the first example, both the dicing lines 50 with the width Δ1 and the dicing lines 50 with the width Δ2 are cut. Consequently, in the first example, the interconnections 48 are cut by dicing.

In this way, according to the present embodiment, the dicing line 50 between the first single chip C1 and second single chip C2 of the same dual chip C has a small width Δ1. This makes it possible to reduce the area of the dual chip C.

FIGS. 10A and 10B are plan views for explaining a yield of the semiconductor device of the first embodiment.

FIG. 10A corresponds to the first example in FIG. 6A. According to the present embodiment, a predetermined number of memory cells are treated as one block and the memory cells in the memory cell array 11 are treated on a block by block basis. Also, in manufacturing plural single chips as semiconductor devices, it is determined whether a given single chip is a non-defective chip (conforming chip) based on whether the number of defective blocks (non-conforming blocks) in the single chip is in a predetermined range. The predetermined range is an example of a first range. Specifically, when the number of defective blocks in a given single chip is less than eight, the single chip is determined to be a non-defective chip. On the other hand, when the number of defective blocks in a given single chip is eight or more, the single chip is determined to be a defective chip (non-conforming chip).

In FIG. 10A, the number of defective blocks in the first single chip C1 is ten, and therefore the first single chip C1 is determined to be a defective chip. On the other hand, the number of defective blocks in the second single chip C2 is two, and therefore the second single chip C2 is determined to be a non-defective chip.

FIG. 10B corresponds to the second example in FIG. 6B. In FIG. 10B, the number of defective blocks in the first single chip C1 is ten and the number of defective blocks in the second single chip C2 is two. Therefore, if the same determination criterion as the first example is adopted, the first single chip C1 is determined to be a defective chip and the second single chip C2 is determined to be a non-defective chip.

However, according to the present embodiment, it is determined whether a dual chip C is a non-defective chip, based on the average number of defective blocks across the single chips in the dual chip C. For example, when the average number of defective blocks in a dual chip C is less than eight, the dual chip C is determined to be a non-defective chip. On the other hand, when the average number of defective blocks in a dual chip C is eight or above, the dual chip C is determined to be a defective chip.

In FIG. 10B, the average number of defective blocks across the single chips in the dual chip C is six (=(10+2)/2). Since the average number is less than 8, the dual chip C is determined to be a non-defective chip. In other words, this determination criterion involves "determining whether the total number of defective blocks in the dual chip C is 16 or above."

In this way, according to the present embodiment, it is determined whether a dual chip C is a non-defective chip, based on the average number of defective blocks in the dual chip C. Consequently, even if either of the first and second single chips C1 and C2 is treated as a defective chip, the dual chip C can be treated as a non-defective chip. This makes it possible to increase a yield of the dual chip C.

Generally, a semiconductor device works to replace any defective block with a normal block called a redundant block. Such replacements are often carried out by a controller in the semiconductor device. When the semiconductor device of the present embodiment is a dual chip C, a defective block in one of the first and second single chips C1 and C2 may sometimes be replaced with a redundant block in the other of the first and second single chips C1 and C2. According to the present embodiment, the controller is designed to be capable of carrying out such a replacement between single chips. Such a controller is mounted, for example, in the circuit chip 2.

FIGS. 11 to 16 are sectional views showing the method of manufacturing the semiconductor device of the first embodiment, where the method shown in FIG. 3 is shown here in more detail.

Figure 11:
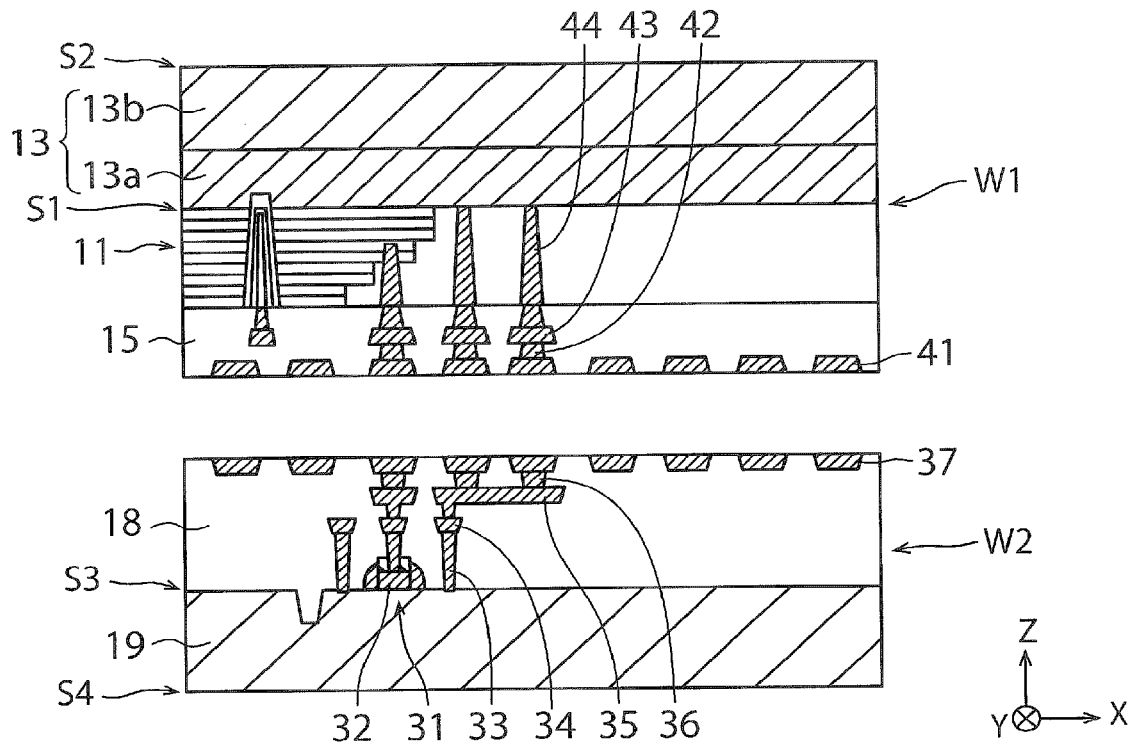
FIGS. 11 to 16 are sectional views showing the method of manufacturing the semiconductor device of the first embodiment.

FIG. 11 shows the array wafer W1 and the circuit wafer W2 as with FIG. 3. This array wafer W1 has already been provided with the first plug 44, but has not been provided with the insulator 45, second plug 46, pad 47, interconnection 48, or passivation film 49. Furthermore, the substrate 13 includes a well 13a and other parts 13b.

Figure 12:
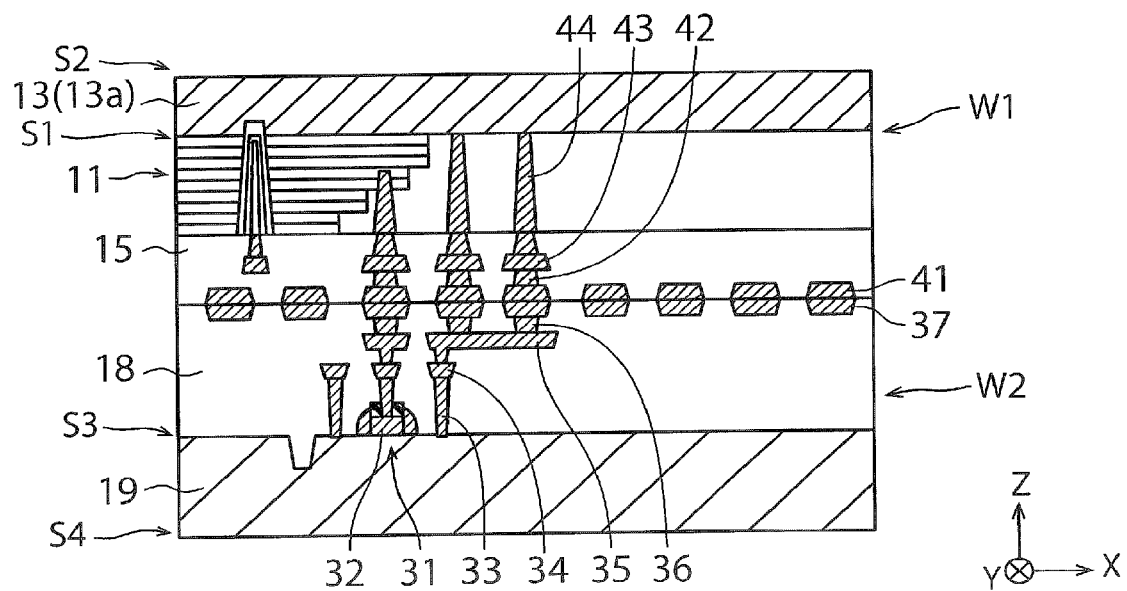

First, the array wafer W1 is bonded to the circuit wafer W2 by mechanical pressure followed by annealing (FIG. 1). Next, the substrate 13 is thinned, thereby removing the parts 13b other than the well 13a from the substrate 13 (FIG. 12).

Figure 13:
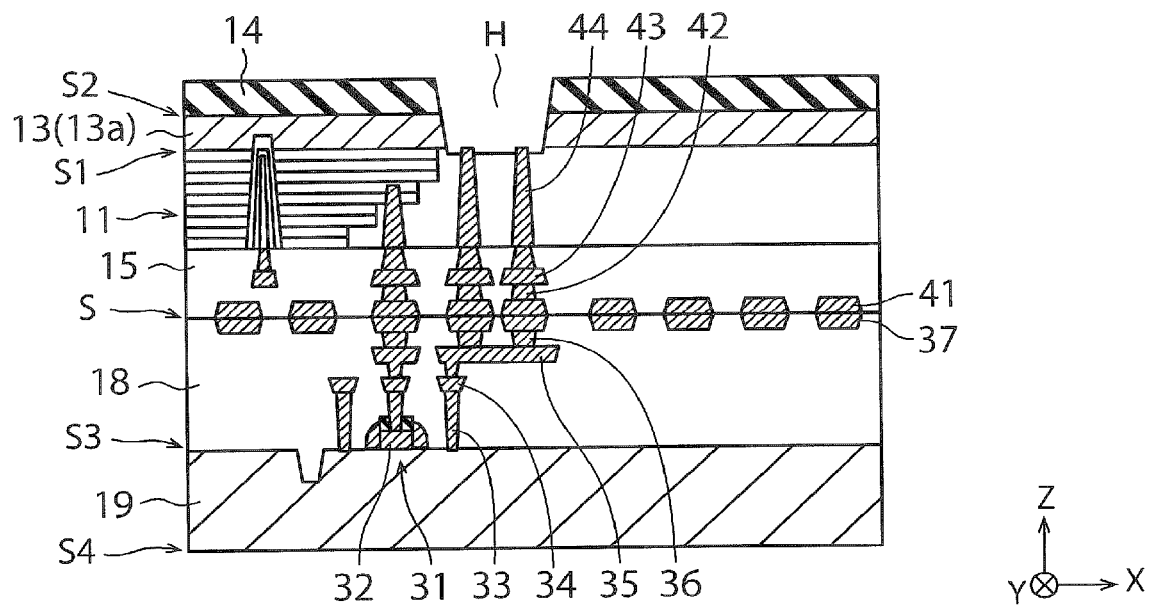
Figure 14:
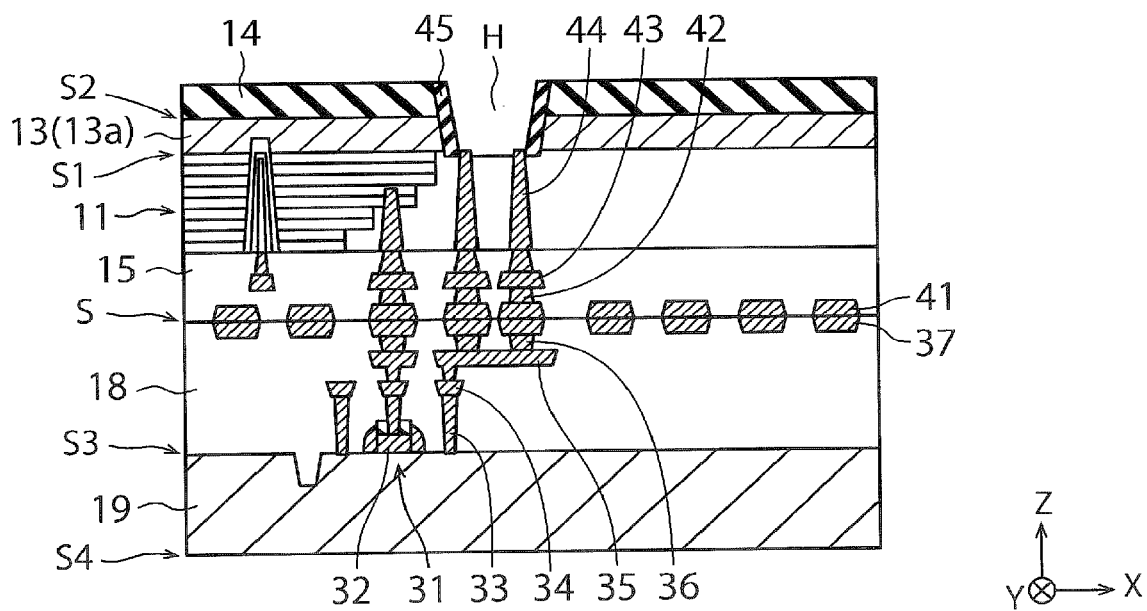
Figure 15:
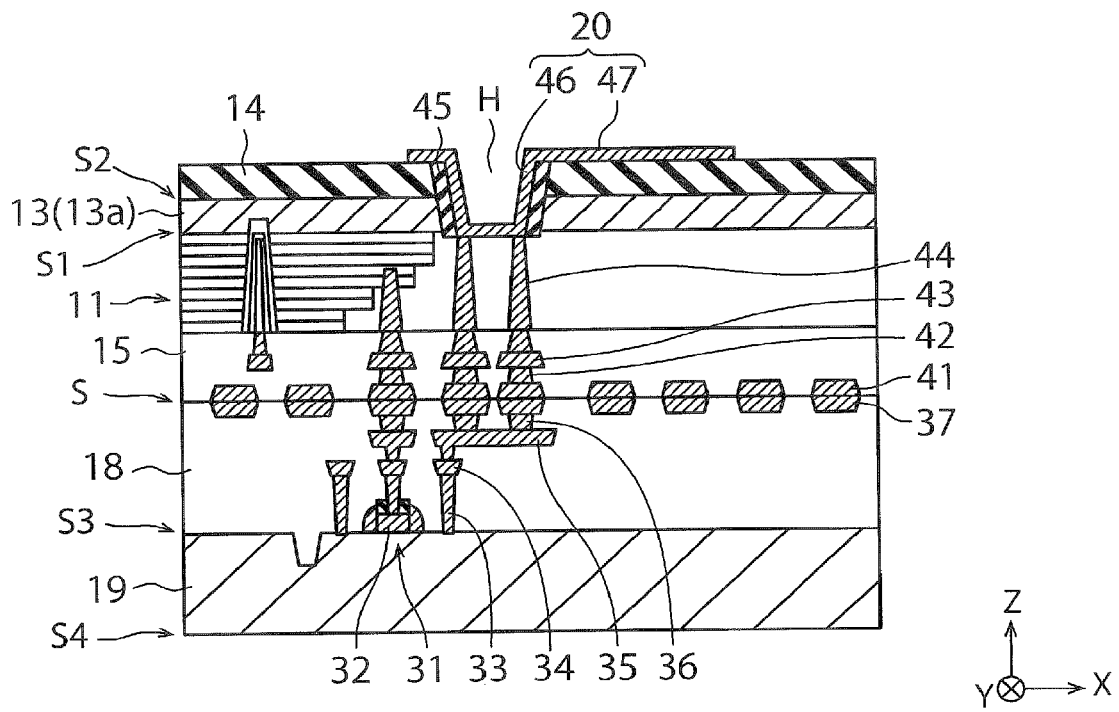

Next, the insulating layer 14 is formed on the substrate 13, and an opening H penetrating the insulating layer 14 and substrate 13 is formed by RIE (Reactive Ion Etching) (FIG. 13). Consequently, the first plug 44 is exposed in the opening H. Next, the insulator 45 is formed on an inner surface of the opening H (FIG. 14). Next, the interconnection layer 20 is formed on surfaces of the first plugs 44, insulator 45, and insulating layer 14 (FIG. 15). Consequently, the interconnection layer 20 is formed on the inner surface and bottom surface of the opening H and on an upper surface of the insulating layer 14. The interconnection layer 20 on the inner surface and bottom surface of the opening H functions as the second plug 46. On the other hand, the interconnection layer 20 on the upper surface of the insulating layer 14 functions as the pad 47.

In this way, in the present method, both the second plug 46 and the pad 47 are formed by the interconnection layer 20. Also, in the present method, the second plug 46 is formed on plural first plugs 44 rather than one first plug 44. However, the second plug 46 may be formed by a layer other than the interconnection layer 20 and may be formed on one first plug 44.

Figure 16:
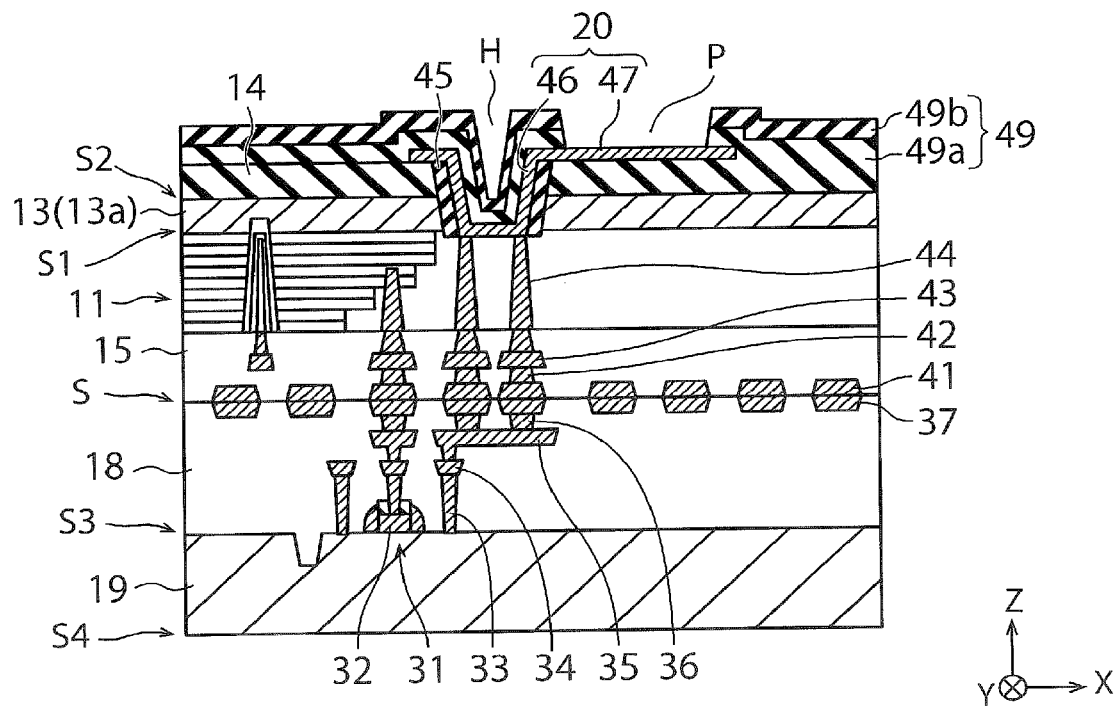

Next, the passivation film 49 including the first insulator 49a and second insulator 49b is formed on the entire surface of the substrate 13 (FIG. 16). Next, the opening P penetrating the passivation film 49 is formed by RIE (FIG. 16). Consequently, the pad 47 is exposed in the opening.

Subsequently, the substrate 19 is thinned, and the array wafer W1 and the circuit wafer W2 are diced into individual single chips or dual chips. Both single chips and dual chips may be manufactured from the set of the array wafer W1 and the circuit wafer W2. Furthermore, bonding wires may be bonded to the pads 47. In this way, the semiconductor device of the present embodiment is manufactured.

Figure 17:
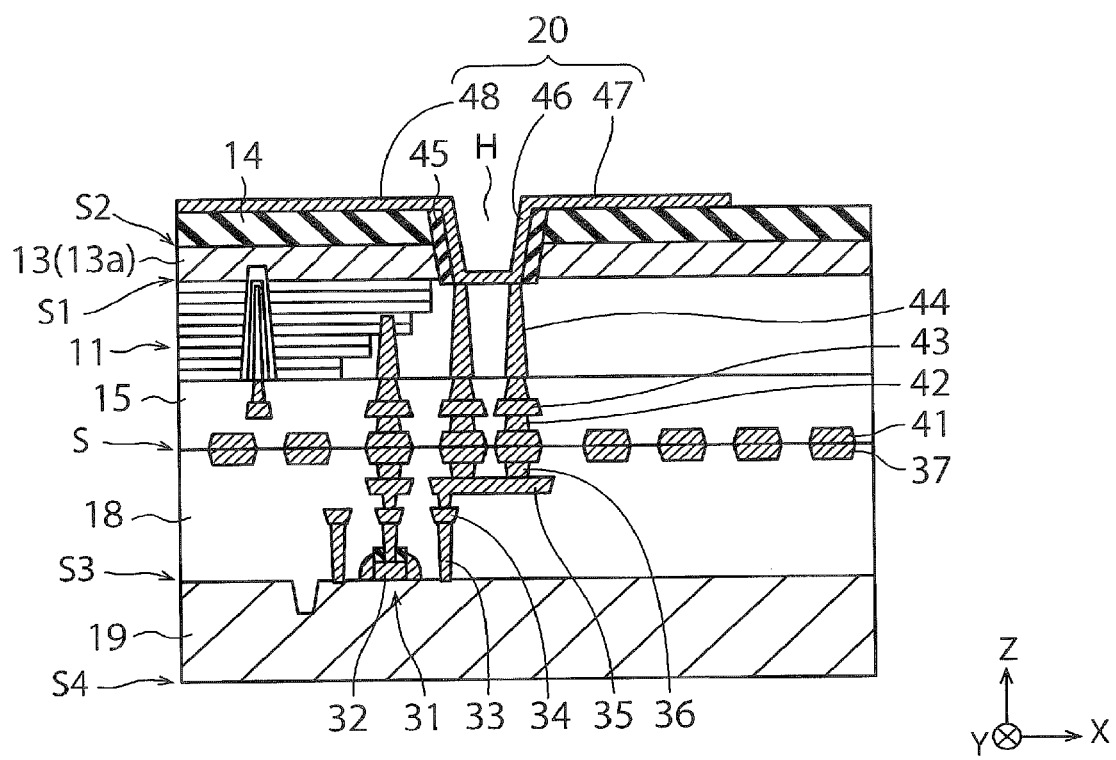
FIGS. 17 and 18 are sectional views showing details of the method of manufacturing the semiconductor device of the first embodiment.
Figure 18:
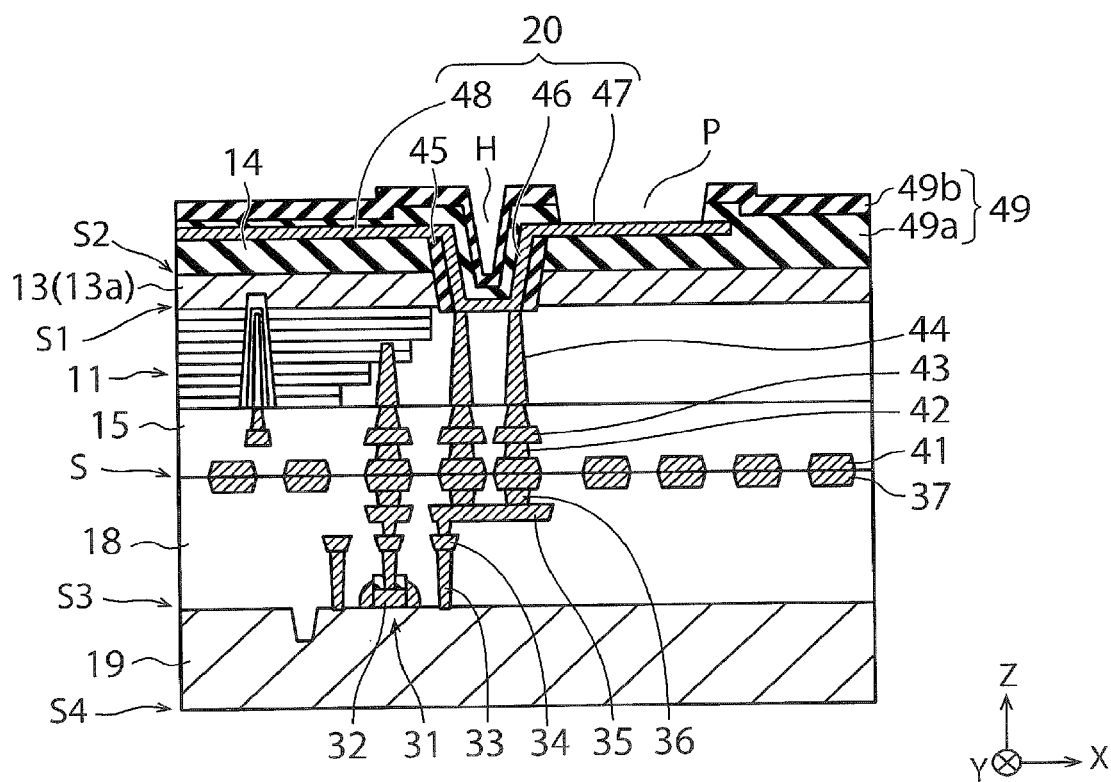

FIGS. 17 and 18 are sectional views showing details of the method of manufacturing the semiconductor device of the first embodiment.

FIG. 17 shows details of FIG. 15. The interconnection layer 20 of FIG. 17 includes not only the second plug 46 and the pad 47, but also the interconnection 48. In this way, both the pad 47 and the interconnection 48 of the present embodiment are formed by the interconnection layer 20.

FIG. 18 shows details of FIG. 16. It should be noted that the interconnection layer 20 includes the interconnection 48 covered with the passivation film 49. When the array wafer W1 and the circuit wafer W2 are diced into individual single chips, the dicing is done such that the interconnection 48 will be cut. On the other hand, when the array wafer W1 and the circuit wafer W2 are diced into individual dual chips, the dicing is done such that the interconnection 48 will not be cut.

Figure 19:
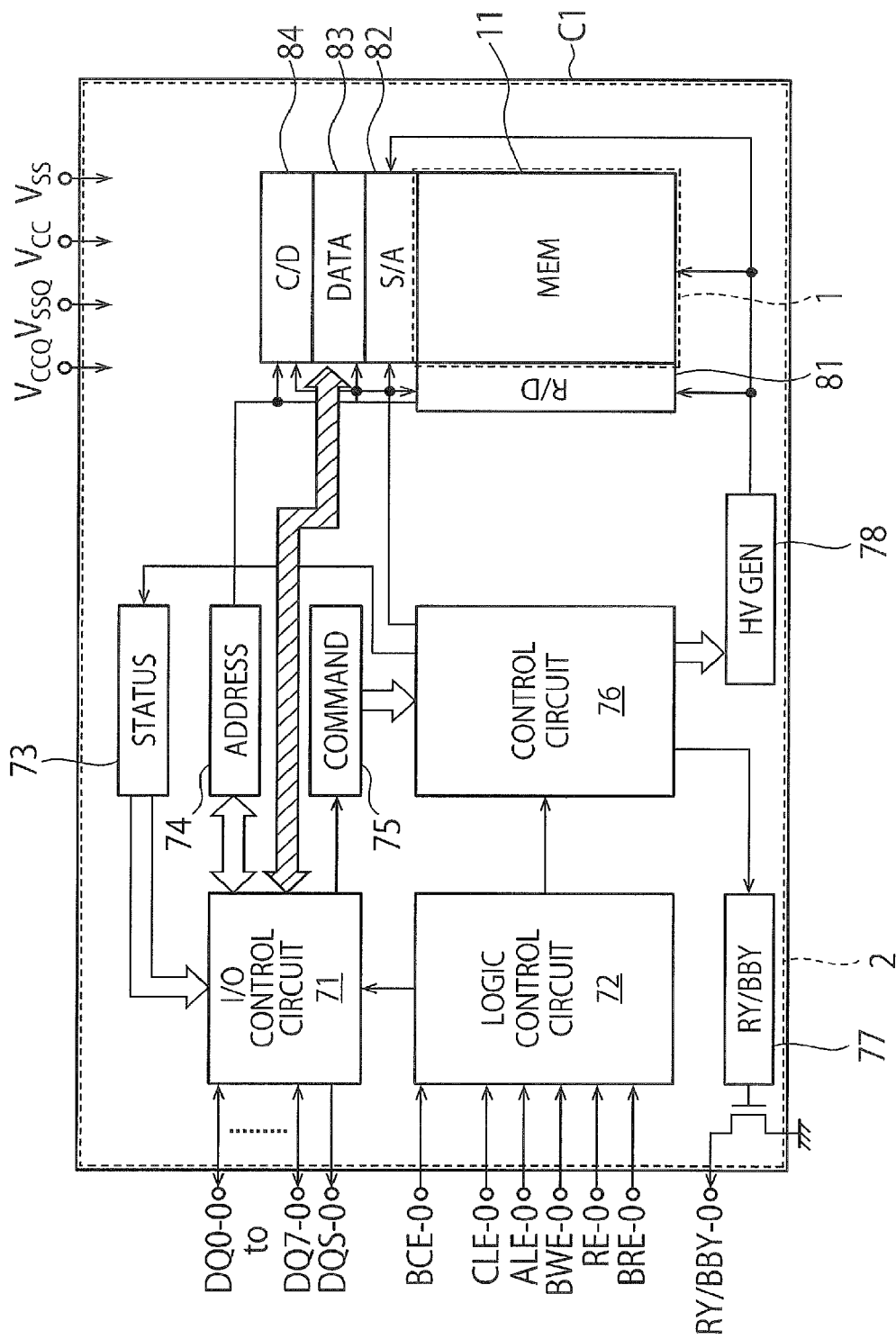
FIG. 19 is a circuit diagram showing a configuration of the semiconductor device of the first embodiment.

FIG. 19 is a circuit diagram showing a configuration of the semiconductor device of the first embodiment. While FIG. 19 shows a configuration of the first single chip C1, the second single chip C2 also has the configuration as shown in FIG. 19.

As shown in FIG. 19, the first single chip C1 has the memory cell array 11 in the array chip 1 and has an I/O (Input/Output) control circuit 71, a logic control circuit 72, a status register 73, an address register 74, a command register 75, a control circuit 76, a ready/busy circuit 77, a voltage generator 78, a row decoder 81, a sense amplifier 82, a data register 83, and a column decoder 84 in the circuit chip 2.

The I/O control circuit 71 exchanges input signals and output signals with a controller (not shown) via data lines DQ0-0 to DQ7-0. The logic control circuit 72 receives a chip enable signal BCE-0, a command latch enable signal CLE-0, an address latch enable signal ALE-0, a write enable signal BWE-0, and read enable signals RE-0 and BRE-0, and controls operations of the I/O control circuit 71 and control circuit 76 of these signals.

The status register 73 is used to store status of a read operation, write operation, and erase operation and notify the controller of completion of these operations. The address register 74 is used to store address signals received by the I/O control circuit 71 from the controller. The command register 75 is used to store the command signals received by the I/O control circuit 71 from the controller.

The control circuit 76 performs read operations, write operations, and erase operations by controlling the status register 73, ready/busy circuit 77, voltage generator 78, row decoder 81, sense amplifier 82, data register 83, and column decoder 84 of command signals from the command register 75.

The ready/busy circuit 77 transmits a ready/busy signal RY/BBY-0 to the controller of operating conditions of the control circuit 76. This makes it possible to indicate whether or not the control circuit 76 is ready to receive a command. The voltage generator 78 generates voltages needed for a read operation, write operation, and erase operation.

The row decoder 81 applies voltages to the word lines WL of the memory cell array 11. The sense amplifier 82 detects data read out to the bit lines BL of the memory cell array 11. The data register 83 is used to store data from the I/O control circuit 71 and sense amplifier 82. The column decoder 84 decodes a column address, and selects a latch circuit in the data register 83 based on a decoding result. The row decoder 81, sense amplifier 82, data register 83, and column decoder 84 function as interfaces for read operations, write operations, and erase operations with respect to the memory cell array 11.

Details of the first single chip C1, second single chip C2, and dual chip C of the present embodiment will be described below.

According to the present embodiment, the first single chip C1 and the second single chip C2 have the same capacity while the dual chip C has twice the capacity of each single chip. The dual chip C is manufactured, for example, when a memory with a capacity equal to that of two single chips is needed.

Generally, single chips and dual chips are manufactured using different mask sets, and therefore, it is troublesome to manufacture both the single chips and the dual chips. However, according to the present embodiment, the array wafer W1 and the circuit wafer W2 used to manufacture the first and second single chips C1 and C2 can be configured to have the same structures as the array wafer W1 and the circuit wafer W2 used to manufacture the dual chip C. Consequently, the first and second single chips C1 and C2 and the dual chip C of the present embodiment can be manufactured with the same mask set. Therefore, the present embodiment allows the first and second single chips C1 and C2 and the dual chip C to be manufactured efficiently.

Generally, when plural mask sets are prepared, there are problems in that manufacturing cost of the semiconductor device increases, that throughput at the time of manufacturing the semiconductor device decreases, and/or that improvement in mass production yield of the semiconductor device is hindered. By manufacturing the first and second single chips C1 and C2 and the dual chip C in the manner described above, the present embodiment can solve these problems.

Whereas a chip (dual chip) including two single chips is manufactured in the present embodiment, a chip including three or more single chips may be manufactured. In that case, desirably the pads 47 in different single chips are electrically connected by the interconnections 48.

Also, the pad 47 of the present embodiment is formed on the side of the surface S2 of the substrate 13, but may be formed on the side of the surface S4 of the substrate 19 instead. Also, the semiconductor device of the present embodiment is manufactured from two wafers (the array wafer W1 and the circuit wafer W2), but may be manufactured from one wafer instead. Also, the semiconductor device of the present embodiment may be a device other than a semiconductor memory.

The interconnection 48 of the present embodiment is formed on the side of the surface S2 of the substrate 13 as with the pad 47. If the interconnection 48 is formed between the surface S1 of the substrate 13 and the surface S3 of the substrate 19, the interconnection 48 may reduce the degree of freedom of layout of other interconnections. Therefore, desirably the interconnection 48 is formed on the side of the surface S2 of the substrate 13. Also, since the pad 47 and the interconnection 48 of the present embodiment are formed of the same interconnection layer 20, the pad 47 and the interconnection 48 can be formed in a simple manner.

As described above, the present embodiment can efficiently manufacture semiconductor chips of different types, specifically, the first and second single chips C1 and C2 and the dual chip C.

Figure 20:
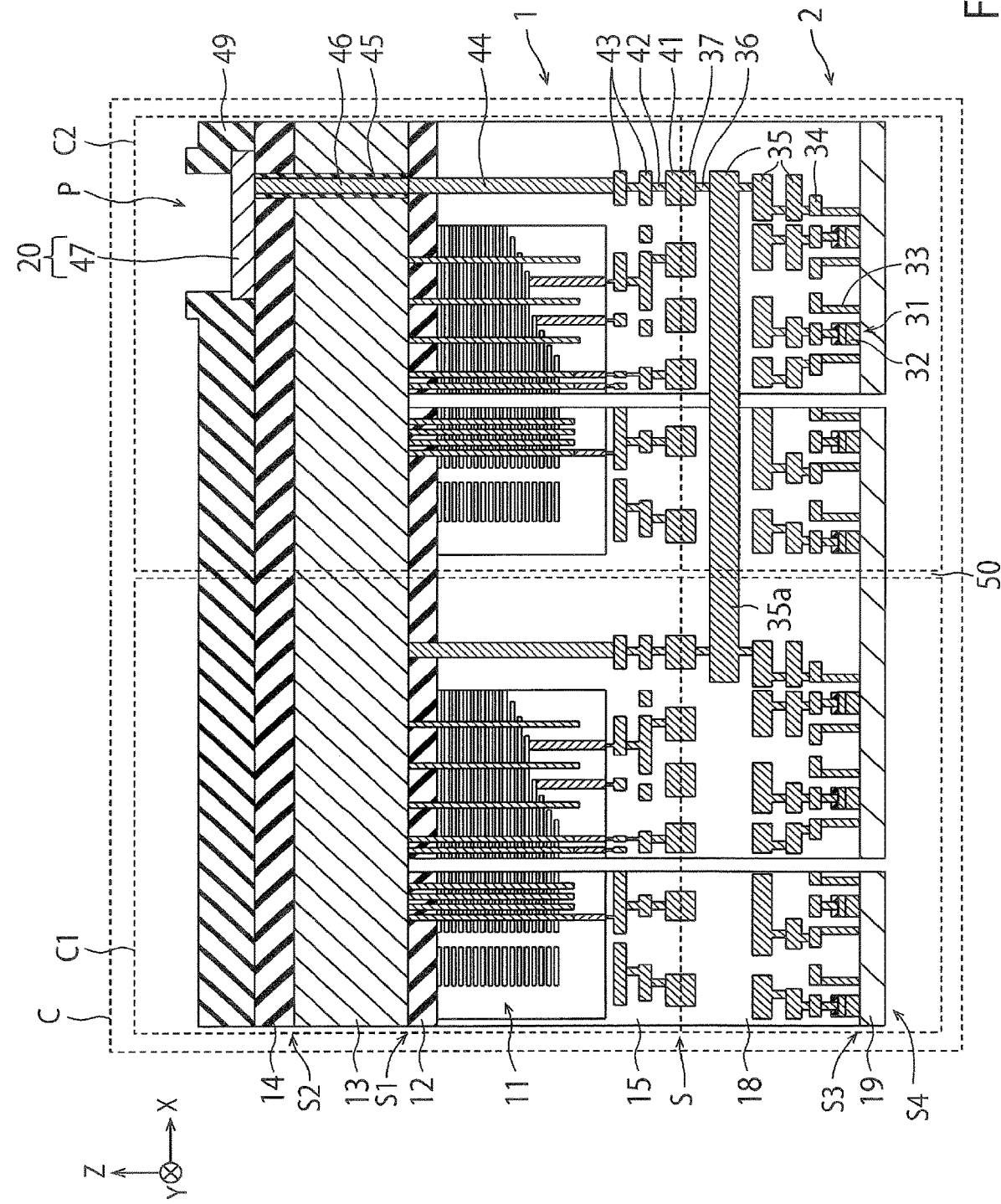
FIG. 20 is a sectional view showing a structure of a first variation of the semiconductor device of the first embodiment.

FIG. 20 is a sectional view showing a structure of a first variation of the semiconductor device of the first embodiment.

FIG. 20 shows a sectional view corresponding to FIG. 4. The interconnection layer 20 of the present variation includes neither the pad 47 in the first single chip C1 nor the interconnection (routing interconnection) 48. Instead, the interconnection layer 35 of the present variation includes an interconnection (routing interconnection) 35a configured to electrically connect an interconnection in the first single chip C1 with an interconnection in the second single chip C2. According to the present variation, a role played by the interconnection 48 can be played by the interconnection 35a instead.

The routing interconnection of the present variation is provided in the circuit chip 2, but may be provided in the array chip 1 instead.

Figure 21:
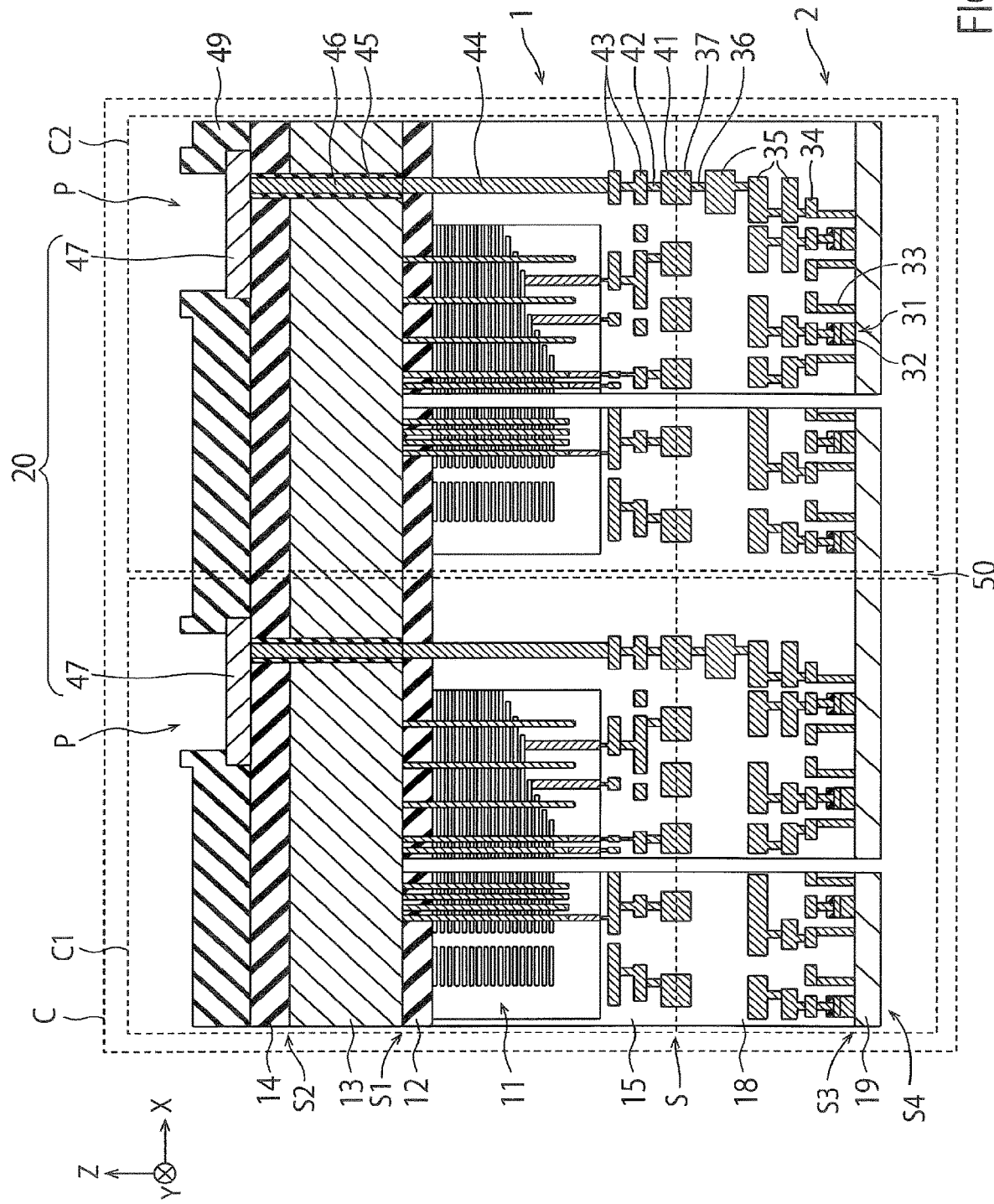
FIG. 21 is a sectional view showing a structure of a second variation of the semiconductor device of the first embodiment.

FIG. 21 is a sectional view showing a structure of a second variation of the semiconductor device of the first embodiment.

FIG. 21 shows a sectional view corresponding to FIGS. 4 and 20. According to the present variation, the interconnection layer 20 does not include the interconnection (routing interconnection) 48 and the interconnection layer 35 does not include the interconnection (routing interconnection) 35a either. According to the present variation, current and voltage are supplied to the circuits in the first single chip C1 from the pad 47 in the first single chip C1 and current and voltage are supplied to the circuits in the second single chip C2 from the pad 47 in the second single chip C2. Therefore, the passivation film 49 of the present variation has an opening P not only on the pad 47 in the second single chip C2, but also on the pad 47 in the first single chip C1.

The structure of the present variation is adopted when it is known before dicing that the first single chip C1 and the second single chip C2 shown in FIG. 21 are used exclusively as single chips. However, if it is determined, after the structure shown in FIG. 21 is manufactured, to use the structure as the dual chip C, the pad 47 in the first single chip C1 and the pad 47 in the second single chip C2 may be electrically connected by a bonding wire or the like.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    forming a first control circuit on a first substrate in a first region of a surface of the first substrate;
    forming a first memory cell array electrically connected to the first control circuit, above the first control circuit in the first region;
    forming a first pad electrically connected to the first control circuit, above the first memory cell array in the first region;
    forming a second control circuit on the first substrate in a second region of the surface of the first substrate;
    forming a second memory cell array electrically connected to the second control circuit, above the second control circuit in the second region;
    forming a second pad electrically connected to the second control circuit, above the second memory cell array in the second region;
    forming a connection line electrically connecting the first pad to the second pad; and
    dicing a wafer including the semiconductor device to cut the connection line, thereby manufacturing a semiconductor device including the first control circuit, the first memory cell array and the first pad, and a semiconductor device including the second control circuit, the second memory cell array and the second pad.

2. The method of claim 1, wherein the first pad, the second pad and the connection line are formed to be continuous with one another in a metal layer.

3. A method of manufacturing a semiconductor device, comprising:
    forming a first control circuit on a first substrate in a first region of a surface of the first substrate;
    forming a first memory cell array electrically connected to the first control circuit, above the first control circuit in the first region;
    forming a first pad electrically connected to the first control circuit, above the first memory cell array in the first region;
    forming a second control circuit on the first substrate in a second region of the surface of the first substrate;
    forming a second memory cell array electrically connected to the second control circuit, above the second control circuit in the second region;
    forming a second pad electrically connected to the second control circuit, above the second memory cell array in the second region;
    forming a connection line electrically connecting the first pad to the second pad; and
    bonding a bonding wire to only one of the first and second pads,
    wherein a chip including the first and second pads is treated as a non-defective chip when a number of defective blocks in one of the first and second memory cell arrays falls within a first range, a number of defective blocks in the other of the first and second memory cell arrays falls outside the first range, and an average number of defective blocks in the first and second memory cell arrays falls within the first range.

4. A method of manufacturing a semiconductor device, comprising:
    forming a first control circuit on a first substrate in a first region of a surface of the first substrate;

forming a first memory cell array electrically connected to the first control circuit, above the first control circuit in the first region;

forming a first pad electrically connected to the first control circuit, above the first memory cell array in the first region;

forming a second control circuit on the first substrate in a second region of the surface of the first substrate;

forming a second memory cell array electrically connected to the second control circuit, above the second control circuit in the second region;

forming a second pad electrically connected to the second control circuit, above the second memory cell array in the second region;

forming a connection line electrically connecting the first pad to the second pad; and forming a first dicing line having a first width and a second dicing line having a second width larger than the first width, on the first substrate, wherein the connection line is formed to cross the first dicing line.

5. A method of manufacturing a semiconductor device, comprising:

forming a first control circuit on a first substrate in a first region of a surface of the first substrate;

forming a first memory cell array electrically connected to the first control circuit, above the first control circuit in the first region;

forming a first pad electrically connected to the first control circuit, above the first memory cell array in the first region;

forming a second control circuit on the first substrate in a second region of the surface of the first substrate;

forming a second memory cell array electrically connected to the second control circuit, above the second control circuit in the second region;

forming a second pad electrically connected to the second control circuit, above the second memory cell array in the second region; and forming a connection line electrically connecting the first pad to the second pad, wherein the first and second memory cell arrays and the first and second control circuits are formed above the first substrate by:

forming the first and second memory cell arrays on the first substrate;

forming the first and second control circuits on a second substrate; and bonding the first substrate to the second substrate via the first and second memory cell arrays and the first and second control circuits.

* * * * *